United States Patent [19]

Mori et al.

[11] Patent Number: 5,284,789
[45] Date of Patent: Feb. 8, 1994

[54] METHOD OF FORMING SILICON-BASED THIN FILM AND METHOD OF MANUFACTURING THIN FILM TRANSISTOR USING SILICON-BASED THIN FILM

[75] Inventors: Hisatoshi Mori, Fussa; Syunichi Sato, Kawagoe; Naohiro Konya, Hino, all of Japan

[73] Assignee: Casio Computer Co., Ltd., Tokyo, Japan

[21] Appl. No.: 690,816

[22] Filed: Apr. 23, 1991

[30] Foreign Application Priority Data

| Apr. 25, 1990 | [JP] | Japan | 2-107376 |
|---|---|---|---|
| Apr. 25, 1990 | [JP] | Japan | 2-107377 |
| Sep. 7, 1990 | [JP] | Japan | 2-235675 |
| Sep. 12, 1990 | [JP] | Japan | 2-239940 |
| Sep. 12, 1990 | [JP] | Japan | 2-239941 |
| Sep. 14, 1990 | [JP] | Japan | 2-242576 |
| Sep. 14, 1990 | [JP] | Japan | 2-242577 |

[51] Int. Cl.$^5$ .................. H01L 21/00; H01L 21/02; H01L 21/326

[52] U.S. Cl. .................. 437/113; 437/225; 437/228; 437/235

[58] Field of Search ................. 437/113, 225, 228, 235

[56] References Cited

U.S. PATENT DOCUMENTS

| 4,692,344 | 9/1987 | Kaganowicz et al. | 437/241 |
|---|---|---|---|
| 4,863,755 | 9/1989 | Hess et al. | 437/225 |

FOREIGN PATENT DOCUMENTS 01-28579 5/1989 Japan.

OTHER PUBLICATIONS

Sinha, Reactive Plasma Deposited Si-N Films for MOS-LSI Passivation, J. of the Electrochem. Soc., vol. 124, Apr. 1978, pp. 601–608.

Thin Solid Films, vol. 168, No. 2, Jan. 15, 1989, pp. 281–289; C. S. Yoo et al, "Factural experimental investigation of plasma–enhanced chemical vapor deposition of silicon nitride thin films".

Solid State Technology, vol. 28, No. 6, Jul. 1985, pp. 197–203; B. Gorowitz et al, "Applications of Plasma Enhanced Chemical Vapor Deposition in VLSI".

Solid State Technology, vol. 23, No. 4, Apr. 1980, pp. 133–136, A. K. Sinha, "Plasma Deposited Polycrystalline Silicon Films".

Solid State Technology, vol. 23, No. 4, Apr. 1980, pp. 137–142, K. M. Mar et al, "Properties of Plasma Enhancement CVD Silicon Nitride: Measurements and Interpretations".

Journal of the Electrochemical Society, vol. 124, Apr. 1978, pp. 601–108, A. K. Sinha et al, "Reactive Plasma Deposited Si-N Films for MOS-LSI Passivation".

Journal of Vacuum Science and Technology: Part B, vol. 6, No. 2, pp. 517–523, J. Dresner, "Plasma deposition of SiO$_2$ gate insulators for a–Si thin–film transistors".

Thin Solid Films, vol. 147, No. 3, Mar. 1987, pp. 259–266, D. J. Eagle, et al "Production of silicon oxides from the glow discharge decomposition of silane and No$_2$".

Primary Examiner—Brian E. Hearn
Assistant Examiner—B. Everhart
Attorney, Agent, or Firm—Frishauf, Holtz, Goodman & Woodward

[57] ABSTRACT

Method of forming a thin film consisting of a silicon-based material includes a first step of setting a substrate subjected to formation of a thin insulating film consisting of the silicon-based material in a chamber having high-frequency electrodes for receiving a high-frequency power while the substrate is kept heated at a predetermined temperature, a second step of supplying a process gas to the chamber, a third step of applying a high-frequency power to the high-frequency electrodes to generate a plasma, a fourth step of depositing an insulator consisting of the silicon-based material on the substrate to a predetermined thickness while gas supply in the second step and supply of the high-frequency power in the third step are kept maintained, and a fifth step of cooling the substrate on which the insulating film is formed and unloading the substrate from the chamber. In the fourth step, the substrate is kept heated within the temperature range of 230° C. to 270° C., and the high-frequency power is controlled to be supplied so that an RF discharge power density falls within the range of 60 to 100 mW/cm$^2$.

18 Claims, 15 Drawing Sheets

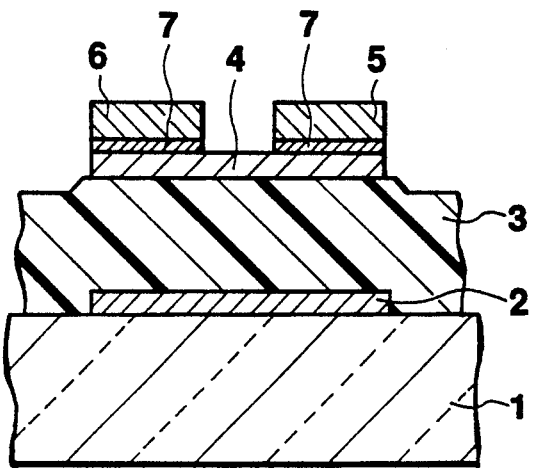
FIG.1 *(PRIOR ART)*
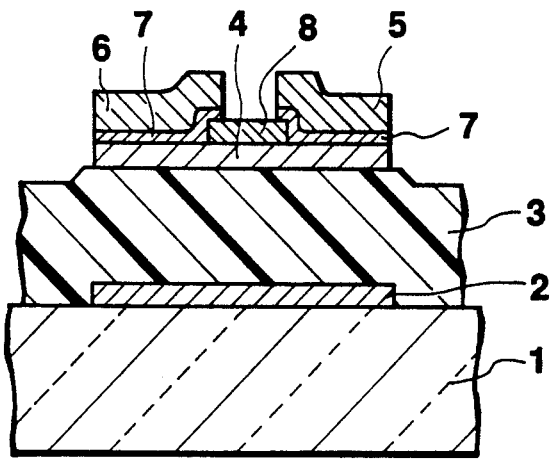
FIG.2 *(PRIOR ART)*

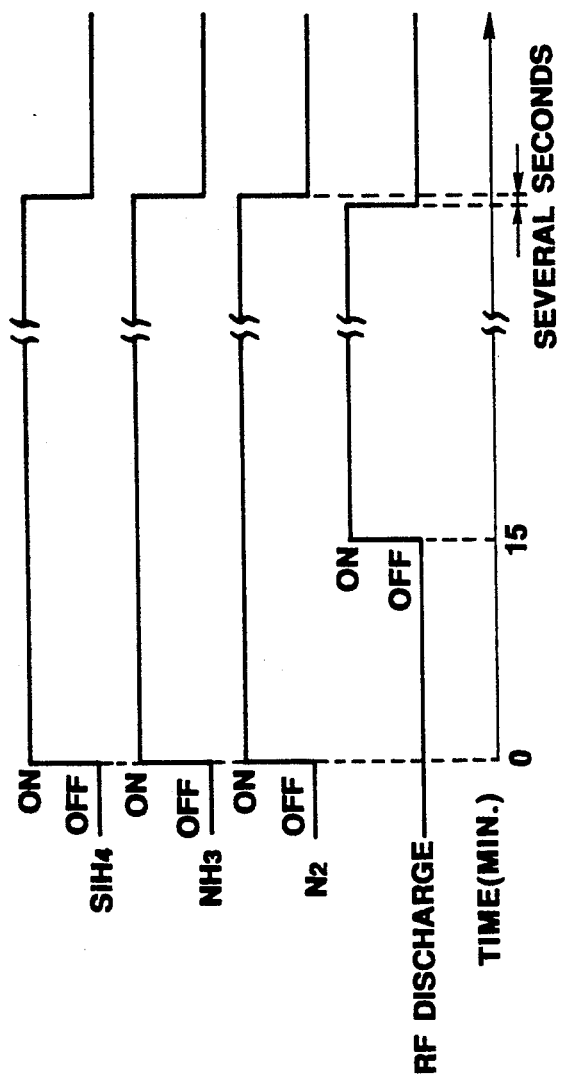
FIG.3 *(PRIOR ART)*
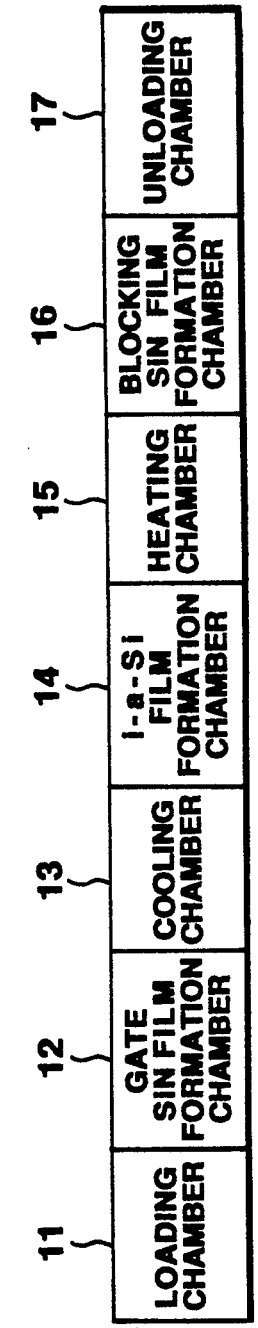
FIG.4 *(PRIOR ART)*

(a-Si:H FILM FORMATION)

(n⁺-a-Si FILM FORMATION)

(a-Si:H FILM FORMATION)

(n⁺-a-Si FILM FORMATION)

METHOD OF FORMING SILICON-BASED THIN FILM AND METHOD OF MANUFACTURING THIN FILM TRANSISTOR USING SILICON-BASED THIN FILM

BACKGROUND OF THE INVENTION

1. Field of the Invention

The present invention relates to a method of forming silicon-based thin films such as a silicon nitride (SiN) film and a silicon oxide (SiO) film, and a method of manufacturing a thin film transistor (TFT) using these silicon-based thin films.

2. Description of the Related Art

Silicon-based thin films are used as insulating films for TFTs, MOS transistors, and integrated circuits using the MOS transistors.

TFTs using these silicon-based thin films are of a staggered type, an inverted staggered type, a coplanar type, and an inverted coplanar type. A structure of a conventional inverted staggered type TFT will be described with reference to FIGS. 1 and 2.

Referring to FIG. 1, a gate electrode 2 consisting of a metal such as tantalum or chromium is formed on an insulating substrate 1 made of glass or the like, and a gate insulating film 3 is formed on the gate electrode 2. An i-type semiconductor film 4 consisting of i-type amorphous silicon (i-a-Si) is formed on the gate insulating film 3 so as to oppose the gate electrode 2. Source and drain electrodes 5 and 6 made of a metal such as chromium are formed on the i-type semiconductor film 4, respectively, through n-type semiconductor layers 7 and are spaced apart from each other by a predetermined distance to form a channel region. Each n-type semiconductor layer 7 consists of n-type amorphous silicon (n+-a-Si) doped with an impurity. A protective layer (not shown) is formed to cover the entire structure.

FIG. 2 shows an improvement of the inverted staggered type TFT shown in FIG. 1. This TFT includes a blocking layer 8 consisting of an insulating film in a region constituting the channel region of the i-type semiconductor layer 4. Other portions of this TFT are the same as those in FIG. 1, and the same reference numerals as in FIG. 1 denote the same parts in FIG. 2.

In these TFTs, silicon nitride (SiN) films are used as the gate insulating films 3 and the blocking layer 8 (only the TFT shown in FIG. 2), and a silicon oxide (SiO) film is used as the protective film (not shown).

In each of these conventional TFTs, a silicon-based thin film such as an SiN film and an SiO film is formed by a plasma CVD method. This plasma CVD method is a method of supplying a process gas to a chamber in which a substrate heated to a predetermined temperature is set, causing a high-frequency glow discharge (RF discharge) upon supply of an RF current so as to set the process gas in a plasma state while the pressure of the process gas is controlled to a predetermined value, and depositing a silicon compound on the substrate, thereby forming a silicon-based thin film.

The process gas consists of a main reaction gas serving as a source gas for a film to be formed and a carrier gas for diluting the main reaction gas to obtain the plasma state. In order to form the SiN film, monosilane ($SiH_4$) gas and ammonia ($NH_3$) gas constitute a main reaction gas, and nitrogen ($N_2$) gas is used as a carrier gas. In order to form the SiO film, monosilane ($SiH_4$) gas and the laughing ($N_2O$) gas constitute a main reaction gas, and nitrogen ($N_2$) gas is used as a carrier gas.

Formation of the above silicon-based thin film is performed by the following steps as indicated by supply of the process gas and the RF discharge timings in FIG. 3.

A substrate heated to a predetermined temperature is set in a chamber, and the chamber is evacuated. The process gas as a gas mixture of the main reaction gas and the carrier gas is supplied and controlled to have a predetermined pressure. When about 15 minutes for stabilizing the pressure of the process gas and the substrate temperature elapse, an RF current is supplied to start an RF discharge, thereby generating a plasma and starting deposition of a silicon-based thin film. When a period of time required for depositing this thin film to a predetermined thickness elapses, supply of the RF current is stopped to interrupt the RF discharge. With a lapse of a few seconds, supply of the process gas is stopped.

In order to obtain a dense silicon-based thin film (especially a silicon nitride thin film) which is free from defects and has a high breakdown voltage, the silicon nitride thin film is formed at a substrate temperature of about 350° C. and an RF power of 120 to 130 mW/cm².

A composition ratio (Si/N) of the number of silicon (Si) atoms to the number of nitride (N) atoms of the resultant silicon nitride film has a value close to a stoichiometric ratio (Si/N=0.75) of the chemically stablest silicon nitride (SiN). The obtained silicon nitride film is dense, is free from defects and has a high breakdown voltage.

Since film formation is performed while the substrate temperature is kept maintained at 350° C., the substrate must be gradually heated not to cause defects such as distortion and cracks of the substrate. In addition, the substrate must be cooled over a long period of time longer than the heating time so as to prevent the silicon nitride film from being cracked by a stress caused by a difference between the thermal expansion coefficients of the substrate and the silicon nitride film. Therefore, according to the conventional film formation method, heating and cooling periods of the substrate are prolonged to degrade the formation efficiency of silicon-based thin films, resulting in low productivity.

The above method of forming the silicon-based thin film is used in the fabrication step of the TFT shown in FIG. 2. Steps in manufacturing this TFT will be described below.

A metal film consisting of chromium (Cr), tantalum (Ta), molybdenum (Mo) or the like is formed on a substrate 1 by a sputtering apparatus and is patterned by a photoetching method, thereby forming a gate electrode 2 and a gate line portion connected to this gate electrode 2.

A gate insulating film 3, an i-type semiconductor layer 4, and a blocking insulating film 8 are sequentially formed on the substrate 1 by a plasma CVD apparatus.

The blocking insulating film 8 is patterned by a photoetching method to leave the blocking insulating film 8 in only the channel region of the i-type semiconductor layer 4.

An n-type semiconductor layer 7 is formed on the i-type semiconductor film 4 by a plasma CVD apparatus and a metal film made of chromium, tantalum, or molybdenum serving as source and drain electrodes 5 and 6 is formed on the n-type semiconductor layer 7 by a sputtering apparatus. The metal film and the i-type semiconductor layer 7 are patterned by a photoetching method to form source and drain electrodes 5 and 6.

The i-type semiconductor layer 4 is patterned in the form of a transistor to finish a thin film transistor or TFT.

During the manufacturing process of the above TFT, the gate insulating film 3 and the blocking layer 8 are made of SiN films, and the i-type semiconductor film 4 comprises a hydrogenated amorphous silicon (a-Si:H) film. The n-type semiconductor film 7 comprises an n+-type a-Si film. The SiN films are formed at a substrate temperature of 350° C. and an RF discharge power density of 120 to 130 mW/cm² so as to obtain dense films having high breakdown voltages. The hydrogenated amorphous silicon (i-a-Si) film is formed at a substrate temperature of about 250° C. and an RF discharge power density of 40 to 50 mW/cm² to as to prevent a decrease in hydrogen content. The n+-type a-Si film is formed under the same conditions as those of the i-a-Si film. In this manner, when a plurality of films are continuously formed on one substrate at different substrate temperatures during film formation, a plasma CVD apparatus having a schematic arrangement shown in FIG. 4 is used. FIG. 4 shows the plasma CVD apparatus for continuously forming the gate insulating film 3, the i-type semiconductor film 4, and the blocking layer 8.

This plasma CVD apparatus comprises a substrate loading chamber 11, a silicon nitride formation chamber (to be referred to as a gate insulating film formation chamber hereinafter) 12 for forming the gate insulating film 3, a substrate cooling chamber 13, an amorphous silicon formation chamber (to be referred to as an i-type semiconductor formation chamber hereinafter) 14 for forming the i-type semiconductor film 4, a substrate heating chamber 15, a silicon nitride film formation chamber (to be referred to as a blocking layer formation chamber hereinafter) 16 for forming the blocking layer 8, and a substrate unloading chamber 17. These chambers are continuously formed.

The gate insulating film 3, the i-a-Si layer 4, and the blocking layer 8 are formed by this plasma CVD apparatus in the following manner.

A substrate is loaded in the substrate loading chamber 11 and is heated to an SiN film formation temperature (about 350° C.). The heated substrate is transferred to the gate insulating film formation chamber 12, and the gate insulating film 3 is formed under the above film formation conditions.

The substrate is then transferred to the substrate cooling chamber 13, and the substrate temperature is decreased to an i-a-Si layer formation temperature (about 250° C.), and the cooled substrate is transferred to the i-type semiconductor film formation chamber 14, and the i-type semiconductor film 4 is formed under the above conditions.

The substrate is then transferred to the substrate heating chamber 15 to heat the substrate to an SiN film formation temperature (about 350° C.). The heated substrate is transferred to the blocking layer formation chamber 16, and the blocking layer 8 is formed under the above conditions.

The substrate is then transferred to the substrate unloading chamber 17 and cooled to an ambient temperature (room temperature). The cooled substrate is removed outside the substrate unloading chamber 17.

In this case, it takes a long period of time to gradually heat the substrate in the loading chamber 11 and the substrate heating chamber 15 and to gradually cool the substrate in the substrate cooling chamber 13 and the substrate unloading chamber 17 so as to prevent cracks caused by a heat stress acting o the SiN film and the i-a-Si layer formed on the substrate.

When the inverted staggered type thin film transistor having no blocking insulating layer 8 shown in FIG. 1 is to be formed, the n-type amorphous silicon layer (to be referred to as an n+-a-Si layer hereinafter) serving as the n-type semiconductor layer 7 is formed immediately after the i-type semiconductor film 4 is formed. The film formation conditions of the n+-a-Si layer can be the same as those of the i-a-Si layer. Therefore, the gate insulating film, the i-type semiconductor layer, and the n-type semiconductor layer of the TFT in FIG. 1 are formed by a plasma CVD apparatus arranged such that the substrate heating chamber 15 and the blocking layer formation chamber 16 are eliminated from the plasma CVD apparatus in FIG. 4, and an n+-a-Si layer formation chamber is arranged between the i-type semiconductor film formation chamber 14 and the substrate unloading chamber 17.

In this staggered type thin film transistor, after the source and drain electrodes and the n+-a-Si layer formed thereon are sequentially formed, the i-a-Si layer and the gate insulating film are sequentially formed, and a gate electrode is formed thereon. Therefore, the i-a-Si layer and the gate insulating film of this staggered type TFT can be formed by a plasma CVD apparatus having contiguous chambers, i.e., a substrate loading chamber, an i-type semiconductor film formation chamber, a substrate heating chamber, a gate insulating film formation chamber, and a substrate unloading chamber.

According to the above conventional method of manufacturing a thin film transistor, the gate insulating film is formed at a film formation temperature of about 350° C., and the i-type semiconductor film is formed at the film formation temperature of about 250° C. For this reason, for example, in the manufacture of the inverted staggered type thin film transistor, the substrate on which the gate insulating film is formed in the gate insulating film formation chamber 12 is adjusted to a temperature at which the i-type semiconductor film can be formed, and the temperature-adjusted substrate must be transferred to the i-type semiconductor film formation chamber 14. For this reason, the conventional plasma CVD apparatus includes the substrate cooling chamber 13 formed between the gate insulating film formation chamber 12 and the next i-type semiconductor film formation chamber 14 to cool the substrate having the gate insulating film thereon to an i-type semiconductor film formation temperature. Since the substrate must be gradually cooled over a long period of time, as described above, it takes a long period of time to cool the substrate having the gate insulating film formed at a temperature of about 350° C. to a temperature of about 250° C.

The above problem is also posed by the manufacture of the staggered type thin film transistor. In this case, the substrate having the i-a-Si film formed in the i-type semiconductor film formation chamber is heated to the gate insulating film formation temperature in the substrate heating chamber, and the heated substrate must be transferred to the gate insulting film formation chamber. Since this substrate heating must be slowly performed over a long period of time, it takes a long period of time to heat the substrate having the i-a-Si layer formed at the film formation temperature of about 250° C. to the temperature of about 350° C.

For this reason, the conventional TFT manufacturing method cannot manufacture thin film transistors with high efficiency.

SUMMARY OF THE INVENTION

It is an object of the present invention to provide a method of forming a dense silicon-based thin film having a high breakdown voltage at a film formation temperature lower than that in the conventional film formation method.

It is another object of the present invention to provide a method of manufacturing a thin film transistor having good characteristics, wherein a silicon nitride film serving as a gate insulating film, and an i-type amorphous silicon layer serving as an i-type semiconductor film can be continuously formed in the respective formation steps without adjusting the substrate temperature, the i-type semiconductor layer has excellent semiconductor characteristics, and the gate insulating film has a high breakdown voltage.

In order to achieve the above objects according to an aspect of the present invention, there is provided a method of forming a thin film consisting of a silicon-based material, comprising:

a first step of setting a substrate subjected to formation of a thin insulating film consisting of the silicon-based material in a chamber having high-frequency electrodes for receiving a high-frequency power while the substrate is kept heated at a predetermined temperature;

a second step of supplying a carrier gas and a reaction gas into the chamber;

a third step of applying a high-frequency power having a power density of 60 to 100 mW/cm$^2$ to the high-frequency electrodes to generate a plasma in the chamber;

a fourth step of maintaining a temperature of 230° to 270° C. for the substrate set in the first step, and of depositing an insulator consisting of the silicon-based material on the substrate to a predetermined thickness while gas supply in the second step and supply of the high-frequency power in the third step are kept maintained; and a fifth step of cooling the substrate on which the insulating film is formed and unloading the substrate from the chamber.

In order to achieve the above objects according to another aspect of the present invention, there is provided a method of manufacturing a thin film transistor, comprising:

a first step of forming a gate electrode on an insulating substrate;

a second step of forming a gate insulating film made of a silicon nitride film formed by a plasma CVD method so as to cover the gate electrode, the plasma CVD method controlling a substrate temperature to fall within a range of 230° to 270° C. and a high-frequency discharge power density to fall within a range of 60 to 100 mW/cm$^2$;

a third step of forming an i-type semiconductor film made of an amorphous silicon layer formed by a plasma CVD method which controls a film formation temperature to fall within a range of 230° to 270° C.; and a fourth step of forming source and drain electrodes which are electrically connected to the i-type semiconductor film through an n-type semiconductor film and are spaced apart from each other by a predetermined distance to form a channel region of the i-type semiconductor film.

With the above arrangements according to the present invention, since the silicon-based thin film is formed while an RF discharge power density of the plasma CVD apparatus is controlled to the range of 60 to 100 mW/cm$^2$, in an initial period of deposition of a silicon compound on the substrate surface, sputtered particles are uniformly attached to the substrate surface, and the deposited film can be uniformly grown, thereby obtaining a thin film having a very small number of defects. Even if the film formation temperature is as low as the range of 230° C. to 270° C., the thin film is free from pinholes and weak spots, and a silicon-based thin film having a high breakdown voltage can be manufactured.

Since the film formation temperature of the manufacturing method of the present invention is lower than that of the conventional manufacturing method by about 100° C., a substrate heating time can be shortened, and a substrate cooling time can also be largely shortened. Therefore, the silicon-based thin film can be manufactured with high efficiency.

According to a TFT manufacturing method using the method of forming the silicon-based thin film of the present invention, both the silicon nitride film and the i-type amorphous silicon film which are to be continuously formed can be formed within almost the same temperature range of 230° to 270° C. A set of the gate insulating film (SiN), the i-type semiconductor film (i-a-Si), and the blocking layer (SiN), all of which are continuously formed in a TFT, or another set of the gate insulating film (SiN), the i-type semiconductor film (i-a-Si), and the n-type semiconductor film (n-a-Si), all of which are continuously formed in a TFT, can be formed at almost the same temperature range of 230° to 270° C. These films or layers can be continuously formed without changing the substrate temperatures in different film formation steps. Therefore, the time required for changing the substrate temperatures in different film formation steps can be greatly reduced, and TFTs can be efficiently manufactured.

BRIEF DESCRIPTION OF THE DRAWINGS

FIG. 1 is a sectional view of a conventional TFT structure;

FIG. 2 is a sectional view of another conventional TFT structure;

FIG. 3 is a timing chart showing a start timing of process gas supply and a start timing of RF discharge;

FIG. 4 is a schematic view showing an arrangement of a plasma CVD apparatus used in a conventional TFT manufacturing method;

DETAILED DESCRIPTION OF THE PREFERRED EMBODIMENTS

Preferred embodiments of the present invention will be described in detail with reference to the accompanying drawings.

First Embodiment

Figure 5:
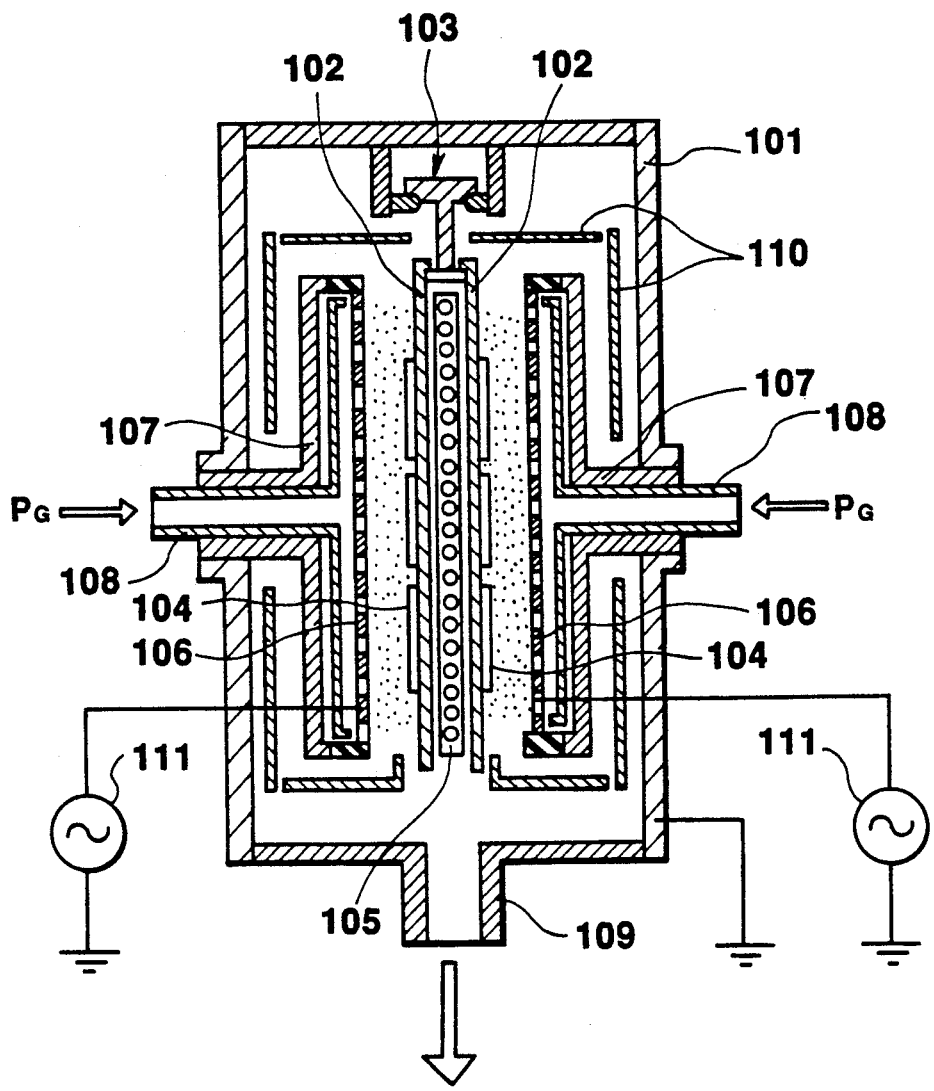
FIG. 5 is a sectional view showing a schematic arrangement of a plasma CVD apparatus used in the present invention.

A silicon-based thin film according to a method of the present invention is formed by using a plasma CVD apparatus shown in FIG. 5. This plasma CVD apparatus employs a vertical both-side discharge scheme.

Referring to FIG. 5, a substrate holder 102 is movably supported by a holder moving mechanism 103 inside a hermetic chamber 101. A plurality of substrates 104 subjected to formation of silicon-based thin films are mounted on both major surfaces of the substrate holder 102. A heater 105 is arranged inside the substrate holder 102 to maintain the substrates 104 to a predetermined temperature. RF electrodes 106 are arranged to respectively oppose the substrates 104 mounted on both the major surfaces of the substrate holder 102. The RF electrodes 106 are mounted in the chamber 101 to be electrically insulated from each other by electrode support members 107. Each RF electrode 106 comprises a metal plate having a large number of holes through which process gas $P_G$ flows toward the substrates 104. An inlet port 108 for receiving the process gas $P_G$ is formed in the rear surface of each RF electrode 106, so that the process gas $P_G$ is supplied from the inlet port 108 to the chamber. The gas in the chamber is discharged through a discharge port 109 by a vacuum pump (not shown) connected to the discharge port 109. Attachment protective plates 110 for preventing attachment of the silicon-based material on the inner wall surface of the chamber are arranged outside the area in which the substrates 104 and the RF electrodes 106 are disposed. A high-frequency power source 111 is connected to the RF electrodes 106. Other members such as the chamber 101 and the substrate holder 102 except for the RF electrodes 106 are grounded.

In order to form a silicon thin film by using this plasma CVD apparatus, the substrates 104 are mounted on the substrate holder 102 and are heated to about 230° C. to 270° C. The substrate holder 102 which holds the heated substrates 104 is mounted on the holder moving mechanism 103 and is set in the chamber at a predetermined position. A door of the chamber is closed, and the chamber is evacuated to a vacuum of about $10^{-7}$ Torr by a vacuum pump, and the process gas as a gas mixture of a main reaction gas and a carrier gas is supplied from the inlet ports 108. The supply amount of carrier gas and the amount of carrier gas discharged from the discharge port 109 are controlled so that the internal pressure of the chamber is stabilized to be about 0.5 Torr. The substrates 104 are heated by the heater 105 so as not to reduce the substrate temperature, so that the substrate temperature is kept almost constant. After the substrate temperature and the internal pressure of the chamber are stabilized, a high-frequency current is supplied from the high-frequency power source 111 to the RF electrodes 106 to start an electrical glow discharge between the RF electrodes 106 and the substrate holder 102 and to generate a plasma between the RF electrodes 106 and the substrate holder. The process gas is decomposed in this plasma state. A chemical reaction occurs to deposit a thin film of a predetermined material on each substrate 104. This film is grown to obtain a desired silicon-based thin film.

According to the film formation method of the present invention, film formation is performed in the substrate temperature range of 230° C. to 270° C. and the RF discharge power density range of 60 to 100 mW/cm². An appropriate process gas is selected in accordance with the type of film to be formed and is supplied in an appropriate amount. When a silicon-based thin film to be formed consists of silicon nitride, monosilane gas or disilane gas and ammonia gas are used to constitute a main reaction gas, and nitrogen, hydrogen, helium, or a gas mixture thereof is used as a carrier gas. For example, when SiH$_4$ and NH$_4$ are used to constitute a main reaction gas, and N$_2$ is used as a carrier gas, they are preferably mixed at a ratio of 1:1:14 to 1:2.7:12.3. A silicon nitride thin film thus manufactured has a composition ratio (Si/N) of 0.75 to 0.85 as a ratio of the number of silicon atoms (Si) to the number of nitrogen atoms (N).

A silicon nitride film was formed under the following conditions falling within the range of the above film formation conditions:

| Substrate Temperature: | | 250° C. |
|---|---|---|
| Main Reaction Gas: | SiH$_4$ | 30 cc/M |
| | NH$_3$ | 60 cc/M |
| Carrier Gas: | N$_2$ | 390 cc/M |
| Pressure: | | 0.5 Torr |
| RF Discharge Frequency: | | 13.56 MHz |
| Discharge Power Density: | | 84 mW/cm² |

The discharge power density is a value obtained by dividing a supplied high-frequency power by the area of each RF electrode. The unit cc/M represents an amount (cc) of 1-atm. 0° C. gas which flows per minute.

The silicon nitride film formed under the above conditions has a very small number of defects and sufficiently high breakdown voltages since the RF discharge power density is as low as 84 mW/cm² although the film formation temperature is as low as 250° C. A composition ratio of this silicon nitride film is about 0.85.

Figure 6:
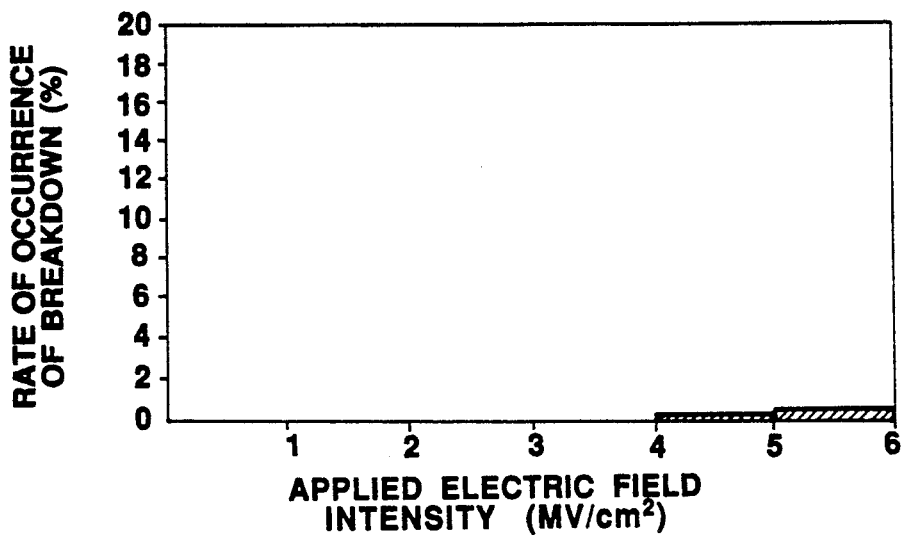
FIG. 6 is a histogram showing a breakdown test result of a silicon-based thin film manufactured by the method of the present invention.

FIG. 6 shows a histogram of a breakdown test result of the silicon nitride film formed under the above film formation conditions. For the sake of comparison, a histogram of a breakdown test result of a silicon nitride film formed under the same conditions described above except that the RF discharge power density is set to be a conventional value, i.e., 127 mW/cm² is shown in FIG. 7.

Figure 7:
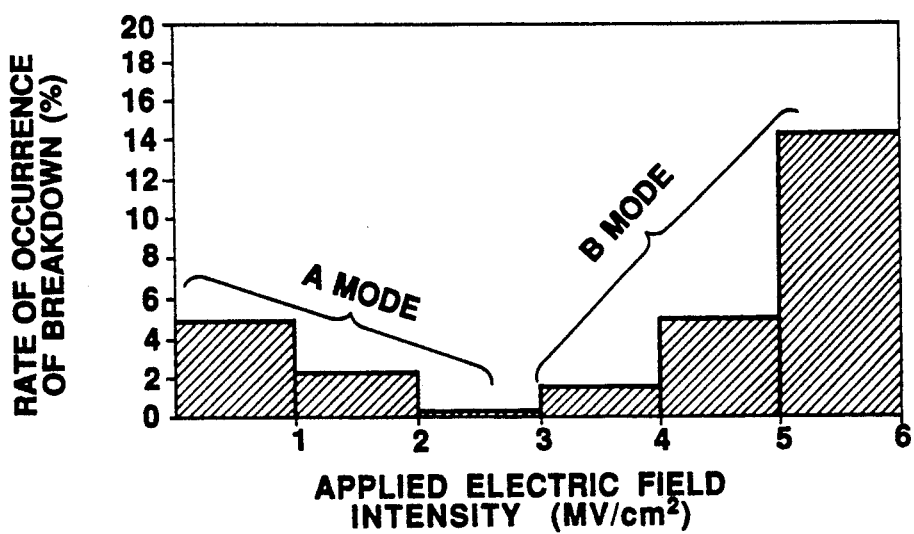
FIG. 7 is a histogram showing a breakdown test result of a silicon-based thin film manufactured by the same method as the conventional technique.
Figure 8:
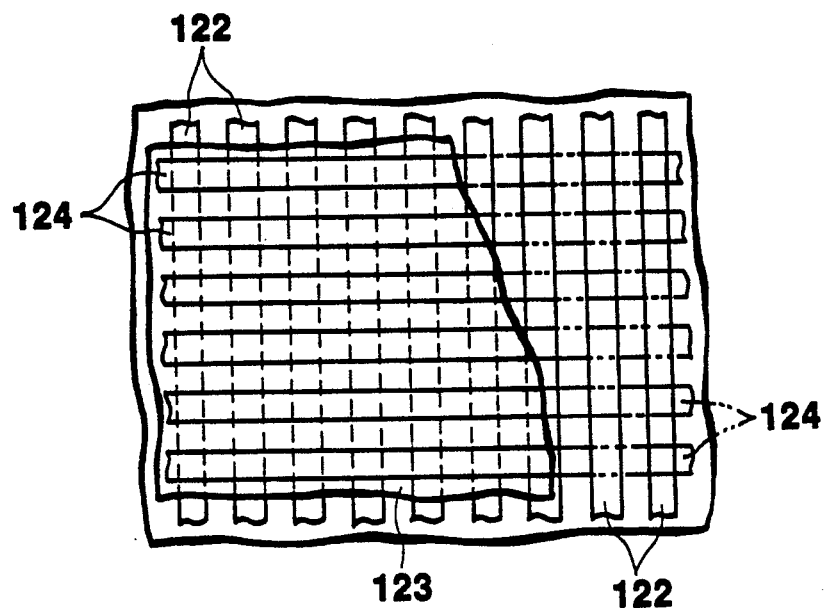
FIG. 8 is a plan view showing a test sample in the breakdown tests of FIGS. 6 and 7.
Figure 9:
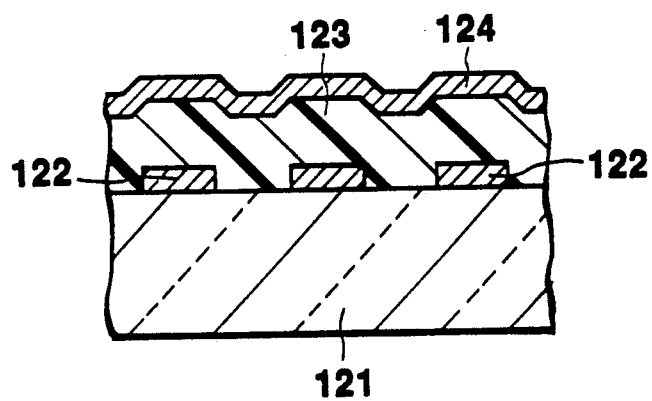
FIG. 9 is a sectional view showing the test sample shown in FIG. 8.

The histograms of the breakdown test results shown in FIGS. 6 and 7 are obtained by measuring breakdown voltages of a silicon nitride film sample shown in FIGS. 8 and 9. This sample is formed such that a plurality of stripe-like lower electrodes 122 are formed parallel to each other on the surface of a glass substrate 121, a silicon nitride film 123 is formed thereon, and a plurality of stripe-like upper electrodes 124 are formed parallel to each other on the silicon nitride film 123 in a direction perpendicular to the lower electrodes 122. A breakdown voltage of the silicon nitride film 123 is measured by the presence/absence of a current flowing through the upper electrodes 124 upon application of a voltage to each lower electrode 122. This is repeated at all intersections between all the lower and upper electrodes 122 and 124. The sample had a total of 691,200 film portions corresponding to the intersections of the upper and lower electrodes and these film portions had a total area of 2.07 cm². The silicon nitride film 123 was formed to have a thickness of 1,000 Å by a parallel flat plate type plasma CVD apparatus.

Breakdown voltages of the silicon nitride film 123 of a sample having the silicon nitride film 123 formed while the discharge power density was controlled to be 127 mW/cm² at a film formation temperature of 250° C. were measured by continuously changing a field intensity of the power applied between the electrodes 122 and 124. A rate of occurrence (i.e., a ratio of a breakdown count of the film portions corresponding to the opposite upper and lower electrodes to the total number of the film portions corresponding to the opposite upper and lower electrodes) of breakdown of the silicon nitride film at each field intensity is given, as shown in FIG. 7. A film portion which corresponded to opposite upper and lower electrodes and through which a current of 1×10⁻⁶ A or more flowed was determined as a defective breakdown portion.

As shown in the breakdown histogram of FIG. 7, in a silicon nitride film formed at a film formation temperature of 250° C. and a discharge power density of 127 mW/cm², an A mode defect (i.e., an initial defect caused by a pinhole) occurring at a low field intensity of 3 MV/cm² or less was as large as about 5% at 1 MV/cm² and about 2.5% at 2 MV/cm². A B mode defect (i.e., a defect caused by a speak spot) occurring at a high field intensity of more than 3 MV/cm² was as large as about 5.2% at 5 MV/cm² and about 14.3% at 6 MV/cm². FIG. 7 shows a breakdown histogram of a silicon nitride film formed at a discharge power density of 127 mW/cm². When the film formation temperature was set at 250° C., the breakdown test result of the resultant silicon nitride film remained almost the same as that of FIG. 7 even if the discharge power density was changed within the range of 120 to 130 mW/cm².

The breakdown characteristics of silicon nitride films are estimated to be degraded in accordance with the following mechanism. When a silicon nitride film is formed at a high discharge power density of 127 mW/cm², expecially in an initial period of film formation, a silicon nitride is discretely dispersed and nonuniformly deposited on the surface of the substrate, and a degree of growth of the silicon nitride film becomes nonuniform to increase defects such as pinholes and weak spots. When a film formation temperature is as high as about 350° C. as in a conventional film formation method, the resultant silicon nitride film can be a dense film free from defects such as pinholes and weak spots. Satisfactory breakdown characteristics of this silicon nitride film can be assured. However, when the film formation temperature is set to about 250° C., a dense silicon nitride film cannot be obtained. As a result, the above defects occur to lower the breakdown voltages.

A silicon nitride film 123 formed at a film formation temperature of 250° C. and a discharge power density of 84 mW/cm² was use as a sample to measure a breakdown voltage of the film 123 following the same procedure as described above. A rate of occurrence of breakdown of this insulating film at the respective field intensities is given, as shown in FIG. 6. A film portion which corresponded to opposite upper and lower electrodes and through which a current of 1×10⁻⁶ A or more flowed was determined as a defective breakdown portion.

As shown in the breakdown histogram of FIG. 6, in a silicon nitride film formed at a film formation temperature of 250° C. and a discharge power density of 84 mW/cm$^2$, an A mode defect occurring at a low field intensity of 3 MV/cm$^2$ or less was almost zero. A B mode defect occurring at a high field intensity of more than 3 MV/cm$^2$ was as small as about 0.4% at 5 MV/cm$^2$ and about 0.6% at 6 MV/cm$^2$.

This decrease in rate or occurrence of breakdown is estimated to be caused for the following reason. When the RF discharge power density is decreased to about 84 mW/cm$^2$, a deposition state of a silicon nitride on the substrate surface is averaged, and the silicon nitride film is uniformly grown. When the silicon nitride film is uniformly grown, defects such as pinholes and weak spots are almost eliminated, so that the resultant silicon nitride film has a sufficiently high breakdown voltage.

A silicon nitride film formed by the method of this embodiment can have a very high breakdown voltage. When this silicon nitride film is used as a gate insulating film for a thin film transistor or a MOS integrated circuit element, the rate of occurrence of breakdown of the thin film transistor and the MOS integrated circuit element can be greatly reduced, and the manufacturing yield and reliability of such transistors and circuit elements can be improved. In addition, the thickness of the gate insulating film (silicon nitride film) can be decreased due to its high breakdown voltage. Therefore, even if a voltage applied to a gate electrode remains the same, if a stronger electric field is applied to a semiconductor layer, a large ON current can be obtained.

In the above embodiment, the RF discharge power density was set to 84 mW/cm$^2$. However, when the discharge power density falls within the range of 60 to 100 mW/cm$^2$, silicon nitride films formed at a discharge power density falling within this range and at a temperature as low as about 250° C. can have breakdown voltages as high as that represented in the breakdown voltage histogram in FIG. 6.

According to the film formation method of this embodiment, a silicon nitride film having a sufficiently high breakdown voltage can be obtained at a film formation temperature (about 250° C.) lower than that of the conventional film formation method by about 100° C. A substrate heating time at the time of formation of a silicon nitride film can be shortened, and a substrate cooling time upon formation of the silicon nitride film can also be shortened. The silicon nitride film can be efficiently formed. In the film formation method of this embodiment, since the RF discharge power density is set to fall within the range of 60 to 100 mW/cm$^2$, a film deposition rate is lower than that of the conventional film formation method having an RF discharge power density of 120 to 130 mW/cm$^2$. However, a decrease in deposition rate is smaller than a decrease in heating and cooling times of the substrate. Therefore, no problem is posed by the decrease in deposition rate.

750-Å thick silicon nitride films having various composition ratios were formed by changing the flow rate ratio of the process gas while the film formation temperature, the pressure, the RF discharge frequency, and the discharge power density of the above film formation conditions were kept unchanged. The density of defects occurring upon application of a high electric field of 3 MV/cm$^2$ between electrodes 122 and 124 of the silicon nitride film samples having the above composition ratios was measured, as shown in FIG. 10.

Figure 10:
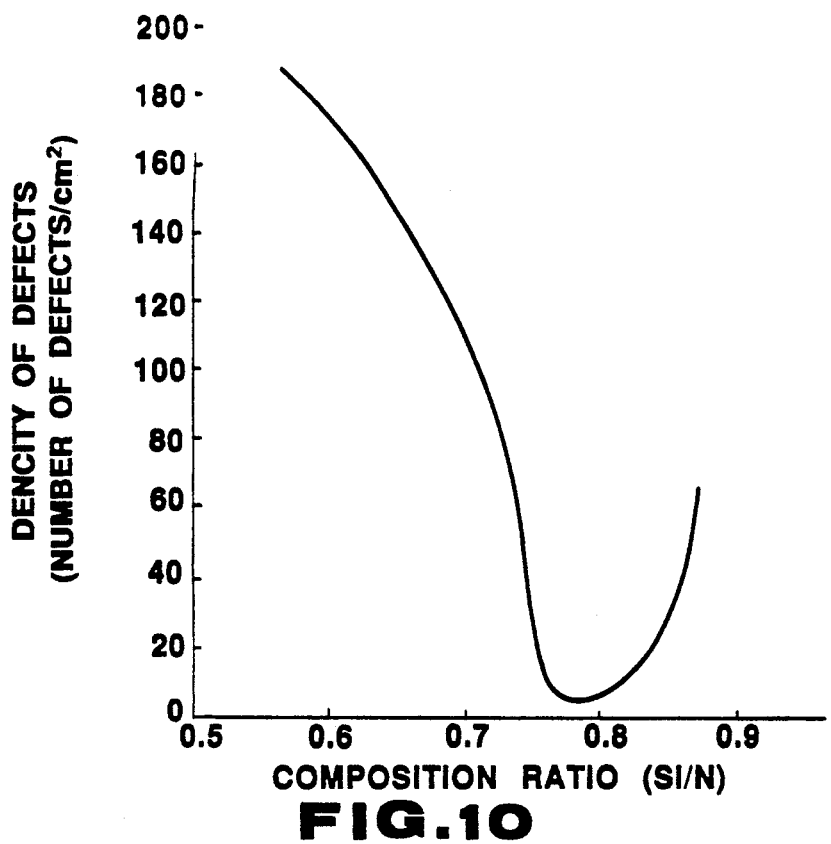
FIG. 10 is a graph showing a relationship between a defect occurrence density and a composition ratio of a silicon-based thin film manufactured by the method of the present invention.

As shown in FIG. 10, the density of defects occurring upon application of the high electric field to the samples varied depending on composition ratios (Si/N) of the samples. A silicon nitride film having a composition ratio of Si/N=0.85 and formed at a gas flow rate ratio of SiH$_4$:NH$_3$:N$_2$=1:1:14 (gas flow rates: 30 cc/M of SiH$_4$; 30 cc/M of NH$_3$; and 420 cc/M of N$_2$) and a silicon nitride film having a composition ratio of Si/N>0.75 and formed at a gas flow rate ratio of SiH$_4$:NH$_3$:N$_2$=1:2.7:12.3 (gas flow rates: 30 cc/M of SiH$_4$; 80 cc/M of NH$_3$; and 370 cc/M of N$_2$) had defect densities as small as 50 defects/cm$^2$ or less. A silicon nitride film having a composition ratio of Si/N falling within the range of 0.75 (exclusive) to 0.85 (inclusive), e.g., a silicon nitride film having a composition ratio of Si/N=0.83 and formed at a gas flow rate ratio of SiH$_4$:NH$_3$:N$_2$=1:2:13 (gas flow rates: 30 cc/M of SiH$_4$; 60 cc/M of NH$_3$; and 390 cc/M of N$_2$) had a smaller defect density of 30 defects/cm$^2$ or less.

As described above, in order to obtain a silicon nitride film having a high breakdown voltage, its composition ratio must be larger than a ratio of the number of Si atoms to that of N atoms stoichiometrically calculated from chemical formula SiN of silicon nitride, i.e., is larger than a value of 0.75 as the chemically stablest state of the ratio of the number of Si atoms to that of N atoms. Preferably, the composition ratio of the silicon nitride film having a high breakdown voltage falls within the range of 0.75 (exclusive) to 0.85 (inclusive).

Second Embodiment

The second embodiment of the present invention will be described below.

Figure 11:
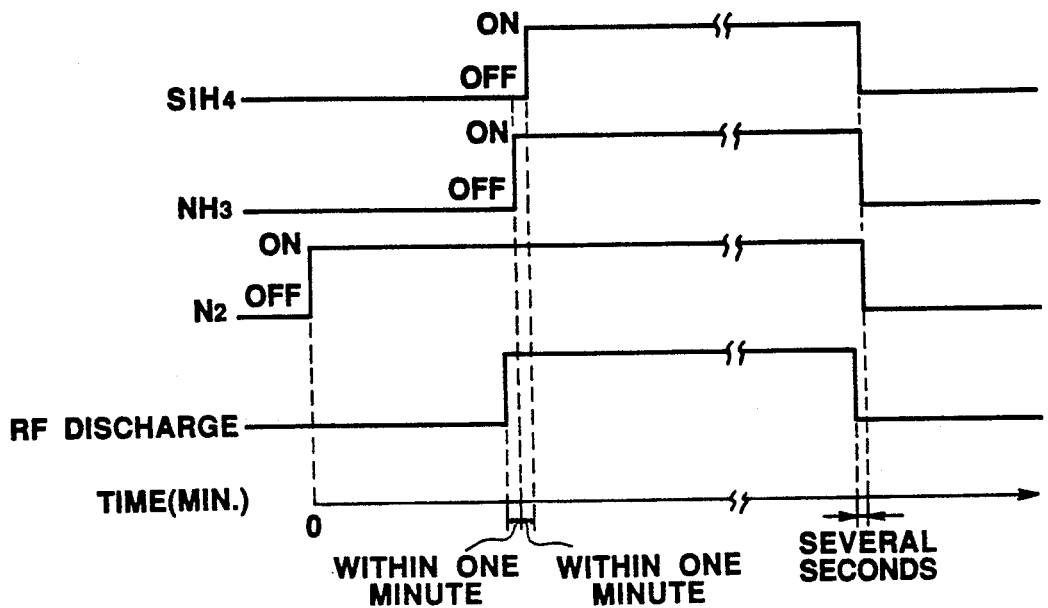
FIG. 11 is a timing chart showing a relationship between a start timing of process gas supply and a start timing of RF discharge in the manufacturing method of the present invention.

In the second embodiment, in addition to the film formation conditions of the first embodiment, an RF discharge power supply timing is optimized to form a silicon-based thin film having a smaller number of defects. FIG. 11 is a timing chart of a process gas supply timing and an RF discharge start timing in formation of a silicon nitride film. A silicon nitride film is formed as follows.

Only the N$_2$ gas serving as a carrier gas is supplied to the chamber first, and the substrate temperature and the internal pressure (gas pressure) of the chamber are adjusted to be a predetermined film formation temperature and a predetermined pressure, respectively. When the substrate temperature and the chamber pressure are stabilized, an RF discharge is started. When the discharge state is stabilized, SiH$_4$ gas and NH$_3$ gas constituting the main reaction gas are supplied to the chamber. When the RF discharge is started and all gases (SiH$_4$, NH$_3$, and N$_2$) required for forming the silicon nitride film are supplied to the chamber, formation of a silicon nitride film is started by a plasma CVD method.

A time required to adjust and stabilize the substrate temperature and the internal pressure of the chamber varies depending on a film formation apparatus and the type of substrate, but must be a minimum of about 15 minutes. A time of several tens of seconds is sufficient to stabilize the RF discharge. The RF discharge can be started when 15 minutes elapse upon supply of N$_2$ gas into the chamber. Supply of the SiH$_4$ and NH$_3$ gases can be started within one minute upon the start of the discharge. The SiH$_4$ and NH$_3$ gases may be simultaneously supplied to the chamber. In order to reduce variations in internal pressure of the chamber by the main reaction gas, the SiH$_4$ and NH$_3$ gases are preferably supplied with a slight time lag, as shown in FIG. 10. With this technique, pressure variations caused by gas supply can be easily corrected. The time lag between supply of the $SiH_4$ gas and supply of $NH_3$ gas is determined by the time required to control the internal pressure of the chamber to a predetermined pressure. In this embodiment, the time lag is about one minute or less. When the $SiH_4$ and $NH_3$ gases are supplied with the time lag, the $NH_3$ gas is preferably supplied first and the $SiH_4$ gas is then supplied.

Gas supply to the chamber and RF discharge in the chamber are intermittently performed during the film formation time determined by the thickness of an SiN film to be formed. When the film formation time elapse, the RF discharge is stopped first, and then supply of gases is stopped with a time lag of several seconds.

Figure 12:
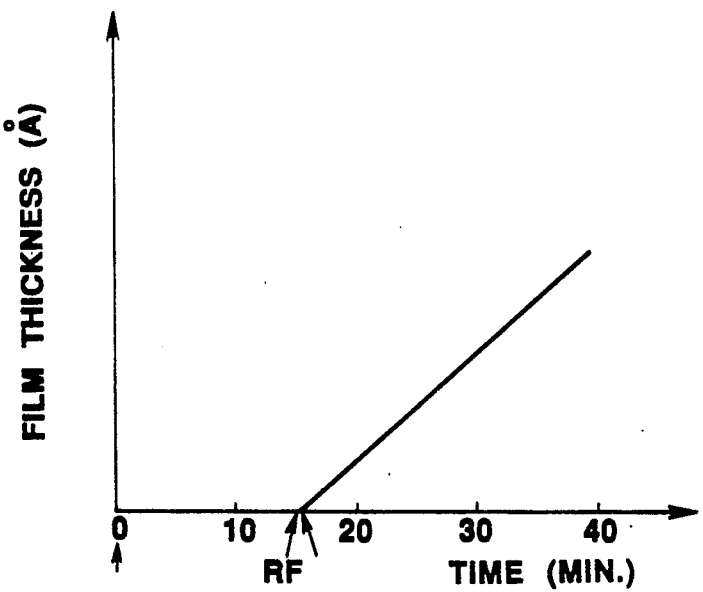
FIG. 12 is a graph showing a relationship between a film formation time and a film thickness in the manufacturing method of the present invention.

In this embodiment, only the $N_2$ gas serving as the carrier gas is supplied to the chamber, and the substrate temperature and the internal pressure of the chamber are adjusted. The RF discharge is then started, and the $SiH_4$ and $NH_3$ gases constituting the main reaction gas are supplied to the chamber. For this reason, a change in thickness of a deposition film as a function of time is linearly increased from the start timing (RF) of the RF discharge, as shown in FIG. 12.

Since the $N_2$ gas supplied to the chamber prior to the start of RF discharge does not contain a material deposited on a substrate upon thermal decomposition, a thermally decomposed material is not deposited on the substrate prior to the RF discharge, unlike in the conventional film formation method. The thickness of the resultant silicon nitride film can be uniform throughout the film. In addition, since the RF discharge is started upon supply of only the $N_2$ gas, a prospective silicon nitride film formation surface (i.e., a substrate surface or a surface of an electrode or the like formed on the substrate surface) of the substrate is plasma-cleaned with the $N_2$ gas. Since the SiN film is formed on the clean surface, the SiN film has uniform quality even at the interface with the deposition surface.

Since the $SiH_4$ and $NH_3$ gases are supplied to the chamber after the RF discharge is started and stabilized, the silicon nitride film formed by the plasma CVD method is uniformly grown throughout the film from the initial period of film formation. The resultant SiN film is free from defects such as pinholes and weak spots and has a high breakdown voltage.

As opposed to the above method, in the conventional method, all the gases are simultaneously supplied to the chamber, and the RF discharge is started after the substrate temperature and the internal pressure of the chamber are stabilized. During a time from the supply of the gases to the chamber to the start of RF discharge, i.e., a time in which the substrate temperature and the internal pressure of the chamber are adjusted, a source gas as an active gas is thermally decomposed and is deposited on the substrate. When the thermally decomposed material of the source gas is attached on the substrate surface prior to the start of RF discharge, a plasma-CVD deposition film formed upon the RF discharge is deposited on the film of the thermally decomposed material.

Since the thermally decomposed material film is nonuniformly attached on the substrate, a degree of growth of the plasma-CVD deposition film becomes nonuniform. Defects such as pinholes and weak spots are formed in the resultant silicon-based thin film. Therefore, the characteristics of the silicon-based thin film become unstable.

Figure 13:
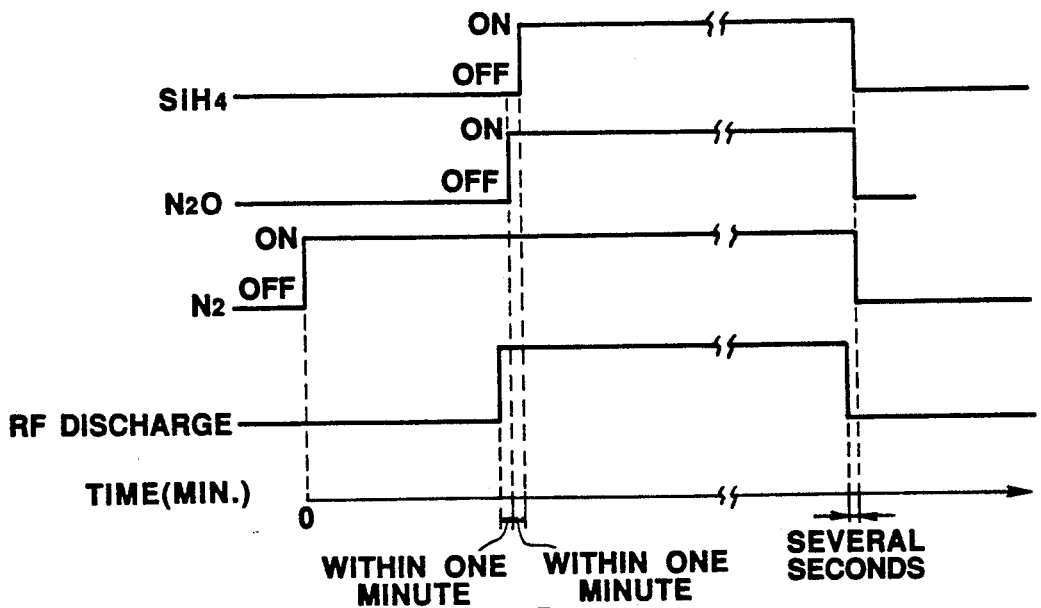
FIG. 13 is a timing chart showing a relationship between a start timing of process gas supply and a start timing of RF discharge when a film different from that manufactured in the method of FIG. 11 is to be formed by a manufacturing method of the present invention.

The first application example in which the present invention is applied to formation of an SiO film will be described below. FIG. 13 is a timing chart of gas supply and RF discharge in formation of an SiO film. The SiO film is formed as follows.

Only $N_2$ gas as a carrier gas is supplied to the chamber first, and the substrate temperature and the internal pressure of the chamber are adjusted. When the substrate temperature and the internal pressure of the chamber are stabilized, an RF discharge is started. When the discharge state is stabilized, the $SiH_4$ and $N_2O$ constituting the main reaction gas are supplied to the chamber, and formation of the SiO film by the plasma CVD method is started. In this embodiment, the $SiH_4$ and $N_2O$ gases may be simultaneously supplied to the chamber. However, the $SiH_4$ and $N_2O$ gases are supplied with a time lag, as shown in FIG. 13, to reduce pressure variations by supply of the gases, and correction of pressure variations can be facilitated. In this case, the $N_2O$ gas is preferably supplied first, and then the $SiH_4$ gas is supplied. The RF discharge and gas supply are stopped in the same manner as in the second embodiment described above upon a lapse of the film formation time.

In the first application example, only the $N_2$ gas as a carrier gas is supplied to the chamber first, the substrate temperature and the internal pressure of the chamber are adjusted, and an RF discharge is started. Thereafter, the $SiH_4$ and $NO_2$ gases serving as the reaction gas are supplied to the chamber. Therefore, a change in thickness of the deposition film as a function of of time is given, as shown in FIG. 12. An SiO film having uniform quality throughout the film and a high breakdown voltage can be formed in the same manner as in the second embodiment.

Figure 14:
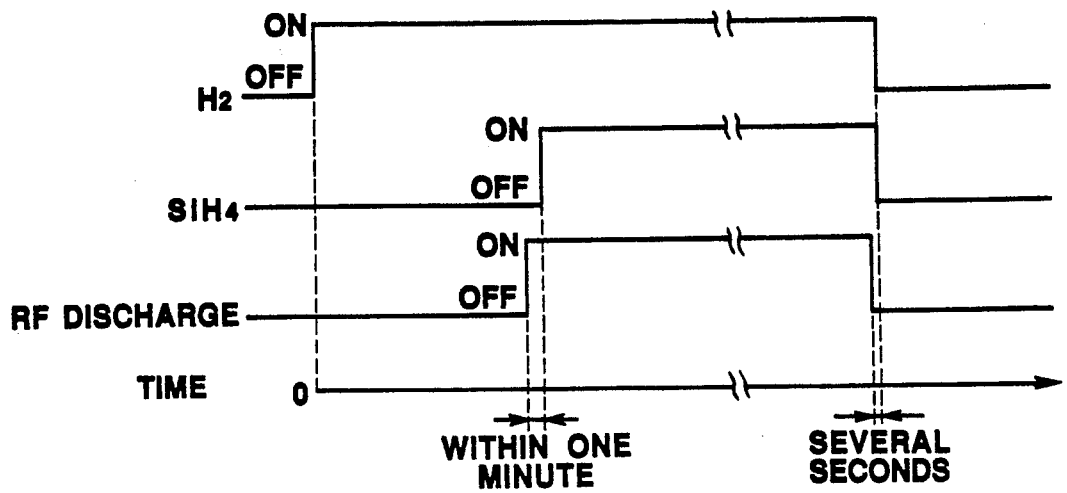
FIG. 14 is a timing chart showing a relationship between a start timing of process gas supply and a start timing of RF discharge when a film different from that manufactured in the method of FIG. 13 is to be formed by a manufacturing method of the present invention.

The second application example in which the present invention is applied to formation of an a-Si:H film will be described below. FIG. 14 is a timing chart of gas supply and RF discharge in formation of an a-Si:H film. The a-Si:H film is formed as follows.

Only $H_2$ gas as a carrier gas is supplied to the chamber first. The substrate temperature and the internal pressure of the chamber are adjusted. When the substrate temperature and the internal pressure of the chamber are stabilized, an RF discharge is started. When the discharge state is stabilized, $SiH_4$ gas serving as a main reaction gas is supplied to start formation of the a-Si:H film by the plasma CVD method. The RF discharge and gas supply are stopped in the same manner as in the second embodiment upon a lapse of the film formation time.

In this application example, only the $H_2$ gas serving as a carrier gas is supplied to the chamber first, the substrate temperature and the internal pressure of the chamber are adjusted, and an RF discharge is started. Thereafter, the $SiH_4$ gas serving as the main reaction gas is supplied to the chamber. A change in thickness of the deposition film as a function of time is given, as shown in FIG. 12. Since the $N_2$ gas supplied to the chamber prior to the start of RF discharge does not contain a material deposited on a substrate upon thermal decomposition, a thermally decomposed material is not deposited on the substrate prior to the RF discharge, unlike in the conventional film formation method. Since the $SiH_4$ gas is supplied to the chamber upon the start of RF discharge, the a-Si:H film formed by the plasma CVD method is uniformly grown throughout the entire area from the initial period of film formation without causing defects such as pinholes and weak spots. The a-Si:H film formed by this formation method has uniform quality throughout the film and stable semiconductor characteristics. In the second application example, the same effect as in the second embodiment, such as a cleaning effect of a film formation surface by a plasma of the $H_2$ gas, can be obtained.

Figure 15:
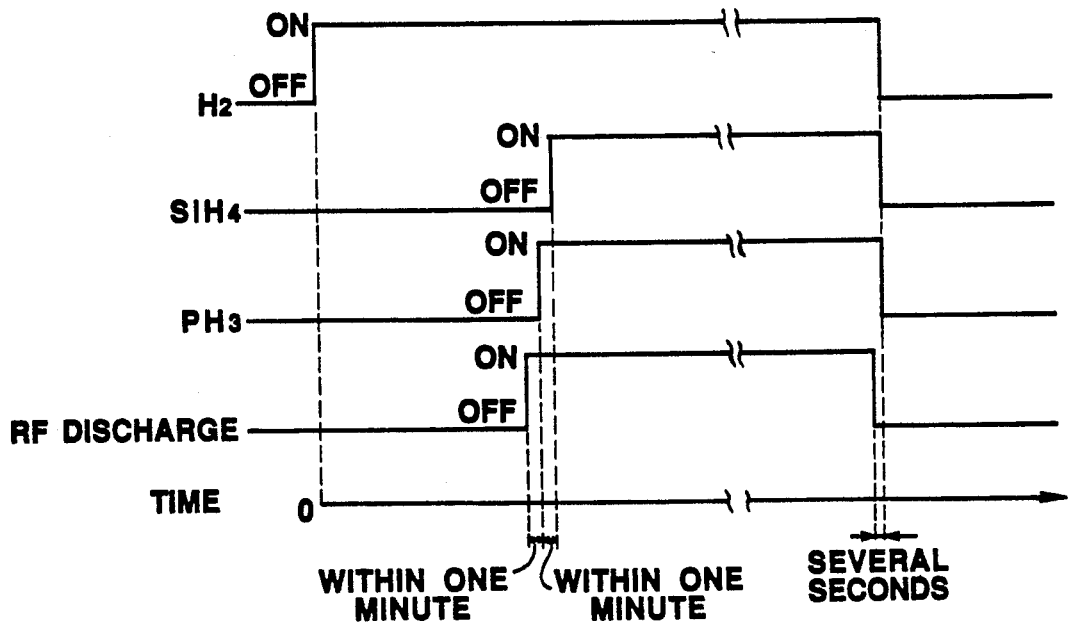
FIG. 15 is a timing chart showing a relationship between a start timing of process gas supply and a start timing of RF discharge when a film different from that manufactured in the method of FIG. 14 is to be formed by a manufacturing method of the present invention.

The third application example in which the present invention is applied to formation of an n+-a-Si film will be described below. FIG. 15 is a timing chart of gas supply and RF discharge in formation of an n+-a-Si film. This n+-a-Si film is formed as follows.

Only $H_2$ gas as a carrier gas is supplied to the chamber first. The substrate temperature and the internal pressure of the chamber are adjusted. When the substrate temperature and the internal pressure of the chamber are stabilized, an RF discharge is started. When the discharge state is stabilized, $SiH_4$ gas and $PH_3$ gas constituting a main reaction gas are supplied to start formation of the n+-a-Si film by the plasma CVD method. In the third application example, the $SiH_4$ and $PH_3$ gases may be simultaneously supplied. When the $SiH_4$ and $PH_3$ gases are supplied with a time lag, as shown in FIG. 10, pressure variations by gas supply can be reduced, and correction of such pressure variations can be facilitated. In this case, the $PH_3$ gas is preferably supplied first, and then the $SiH_3$ gas is supplied to the chamber. The RF discharge and gas supply are stopped in the same manner as in the second embodiment upon a lapse of the film formation time.

In the third application example, only the $H_2$ gas serving as a carrier gas is supplied to the chamber first, the substrate temperature and the internal pressure of the chamber are adjusted, and an RF discharge is started. Thereafter, the $SiH_4$ and $PH_3$ gases constituting the main reaction gas are supplied to the chamber. A change in thickness of the deposition film as a function of time is given, as shown in FIG. 12. Therefore, the entire n+-a-Si film has uniform quality and stable conductive characteristics.

Third Embodiment

In addition to the first embodiment, the third embodiment aims at manufacturing a defect-free silicon-based thin film by controlling a state at the start of RF discharge.

Figure 16:
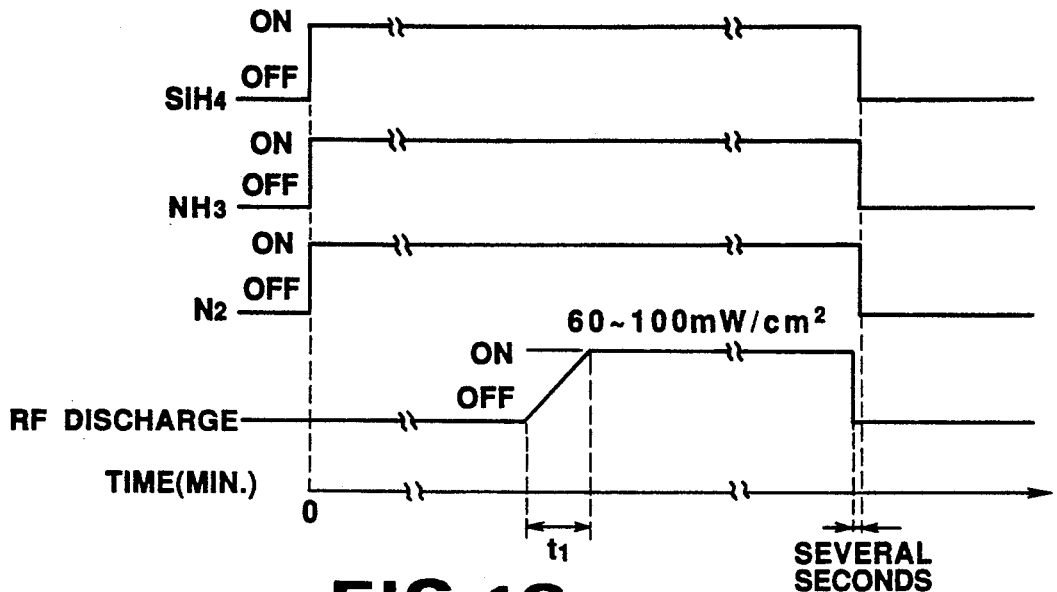
FIG. 16 is a timing chart showing a start timing of RF discharge and an RF discharge power supply state in a manufacturing method of the present invention.

FIG. 16 is a timing chart of gas supply and RF discharge in formation of a silicon nitride film. This silicon nitride film is formed as follows. $SiH_4$, $NH_3$, and $N_2$ constituting a process gas are supplied as a process gas to the chamber. The substrate temperature and the internal pressure (gas pressure) of the chamber are adjusted to a predetermined film formation temperature and a predetermined pressure, respectively. When the substrate temperature and the internal pressure of the chamber are stabilized, an RF discharge is started. At the time of the start of RF discharge, a rate of increase in discharge power density to a set value (60 to 100 mW/cm²) is controlled to fall within the range of 3 to 10 mW/cm² per second. A time $t_1$ required to increase the discharge power density to the set value at this rate of change is 10 to 20 seconds. A relationship between the time $t_1$, the set value of the discharge power density, and the rate of increase in discharge power density is summarized in [Table 1].

[TABLE 1]

| Set value (mW/cm²) | Rate of Increase (mW/cm²) per second | Time (sec.) |
|---|---|---|
| 60 | 6 | 10 |
| 60 | 3 | 20 |
| 100 | 10 | 10 |
| 100 | 5 | 20 |

After the discharge power density is increased to the set value, the discharge power density is maintained at the set value for the film formation time determined by the thickness of a silicon nitride film to be formed. When the film formation time elapses, the RF discharge is stopped. Supply of the process gas is stopped with a time lag of several seconds.

In the third embodiment, when RF discharge is started, the discharge power density is gradually increased to the set value at a rate of increase of 3 to 10 mW/cm² per second, and the discharge power density can be increased in a stable discharge state. For this reason, SiN deposited on the substrate can be uniformly deposited from the initial period of film formation. In addition, since the discharge power density is gradually increased, the deposition film is gradually grown during the film formation time, and the deposition film in the initial period of film formation can be dense. When the deposition film in the initial period of film formation is uniform and dense, a degree of growth of a film deposited thereon becomes uniform. The resultant silicon nitride film becomes a film which is free from defects such as pinholes and weak spots and which has stable characteristics. This SiN film has a sufficiently high breakdown voltage.

In the third embodiment, a rate of increase in discharge power density is set to fall within the range of 3 to 10 mW/cm² per second due to the following reason. When a rate of increase in discharge power density is higher than 10 mW/cm² per second or more, uniformity and denseness of the deposition film in the initial period of film formation are lost. When the rate of increase in discharge power density is decreased, the uniformity and denseness of the deposition film in the initial period of film formation can be improved. When the rate of increase is less than 2 mW/cm² per second or less, it takes much time to set the discharge power density to the set value, thus degrading film formation efficiency. Therefore, the rate of increase in discharge power density preferably falls within the range of 2 to 10 mW/cm² per second. Within this range, an SiN film having stable characteristics and free from defects such as pinholes and weak spots can be obtained without greatly degrading film formation efficiency.

To the contrary, in the conventional film formation method, at the start of RF discharge, the discharge power density is increased quickly within a very short period of 1 to 2 seconds. When the discharge power density is quickly increased within a short period of time, a discharge state becomes unstable, and the silicon-based material deposited on the substrate in the initial period of film formation is nonuniformly deposited.

When the silicon-based material in the initial period of film formation is deposited on the substrate in a dispersed manner, a degree of growth of the deposition film becomes nonuniform. For this reason, in the conventional film formation method, defects such as pinholes and weak spots are formed in the resultant silicon-based thin film, so that the characteristics of the silicon-based thin film become unstable.

Figure 17:
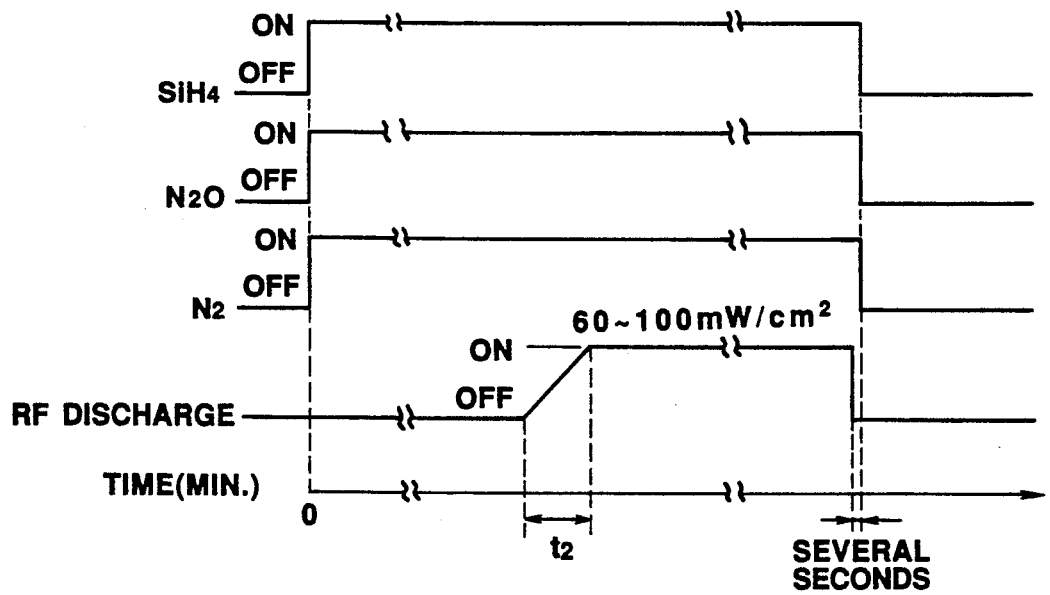
FIG. 17 is a timing chart showing a start timing of RF discharge and an RF discharge power supply state when a film different from a film formed by the manufacturing method of FIG. 16 is to be formed by a manufacturing method of the present invention.

The first application example in which the third embodiment is applied to formation of an SiO film. FIG. 17 is a timing chart of gas supply and RF discharge in formation of an SiO film. The SiO film can be formed as follows.

$SiH_4$, $N_2O$, and $N_2$ gases constituting a process gas are supplied as a process gas, the substrate temperature and the internal pressure of the chamber are adjusted, and an RF discharge is started. At the time of the start of RF discharge, a rate of increase in discharge power density to a set value is controlled to fall within the range of 3 to 10 $mW/cm^2$ per second. In this case, the set value of the discharge power density in formation of the SiO film is the same (60 to 100 $mW/cm^2$) as in formation of the SiN film in the third embodiment. A relationship between a time $t_2$ required to increase the discharge power density to the set value, the set value of the discharge power density, and the rate of increase in discharge power density is the same as the above [Table 1]. The RF discharge and the gas supply are stopped in the same manner as in the third embodiment upon a lapse of the film formation time.

At the time of the start of RF discharge in this first application example, since the discharge power density is slowly increased to the set value at a rate of 3 to 10 $mW/cm^2$ per second, an SiO film free from defects such as pinholes and weak spots and having stable characteristics can be obtained.

In the above first application of the third embodiment, the rate of increase in discharge power density is set to fall within the range of 3 to 10 $W/cm^2$ per second. This rate may be 2 to 10 $mW/cm^2$ per second in the same manner as in the third embodiment.

Figure 18:
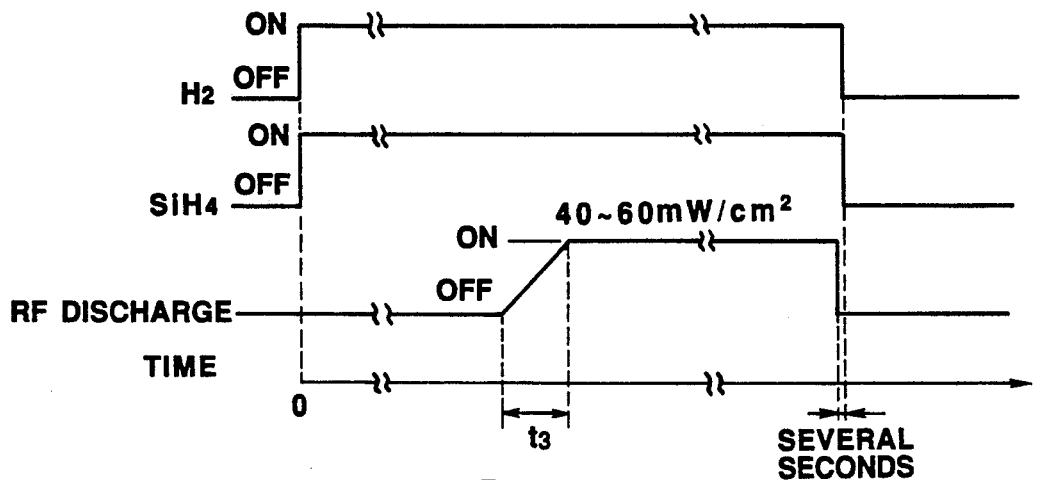
FIG. 18 is a timing chart showing a start timing of RF discharge and an RF discharge power supply state when a film different from a film formed by the manufacturing method of FIG. 17 is to be formed by a manufacturing method of the present invention.

A second application example in which the third embodiment is applied to formation of an a-Si:H film will be described below. FIG. 18 is a timing chart of gas supply and RF discharge in formation of an a-Si:H film. This a-Si:H film is formed as follows.

$SiH_4$ and $H_2$ gases constituting a process gas are supplied to the chamber, the substrate temperature and the internal pressure of the chamber are adjusted, and an RF discharge is started. At the time of the start of RF discharge, a rate of increase in discharge power density to a set value (40 to 60 $mW/cm^2$ in formation of the a-Si:H film) is set to fall within the range of 2 to 5 $mW/cm^2$ per second. A relationship between a time $t_3$ required for increasing the discharge power density to the set value at this rate, the set value of the discharge power density, and the rate of increase in discharge power density is summarized in [Table 2] below.

| Set value ($mW/cm^2$) | Rate of Increase ($mW/cm^2$) per second) | Time (sec.) |
|---|---|---|
| 40 | 4 | 10 |
| 40 | 3 | 20 |
| 50 | 5 | 10 |
| 50 | 2.25 | 20 |

After the discharge power density is increased to the set value, the discharge power density is maintained at the set value for the film formation time determined by the thickness of an a-Si:H film to be formed. When the film formation time elapses, the RF discharge is stopped. Supply of the process gas is stopped with a time lag of several seconds.

In the second application example of the third embodiment, at the time of the start of RF discharge, since the discharge power density is slowly increased to the set value in the range of 2 to 5 $mW/cm^2$ per second, the discharge power density can be increased in a stable discharge state. The a-Si:H film deposited on the substrate is uniformly deposited from the initial period of film formation. In addition, when the discharge power density is slowly increased, the deposition film is slowly grown, and a dense film is obtained in the initial period of film formation. When the deposition film in the initial period of film formation is uniform and dense, a degree of growth of a film formed thereon becomes uniform. The resultant a-Si:H film is free from defects such as pinholes and weak spots and has stable characteristics. This a-Si:H film has good semiconductor characteristics.

In this second application example of the third embodiment, the uniformity and denseness of the deposition film in the initial period of film formation can be improved when the rate of increase in discharge power density is decreased. However, if this rate of increase is excessively low, it takes a long period of time to set the actual discharge power density to the set value, thus degrading film formation efficiency. The rate of increase in discharge power density preferably falls within the range of 2 to 10 $mW/cm^2$ per second. Within this range, a stable a-Si:H film free from defects such as pinholes and weak spots and having stable characteristics can be obtained without excessively degrading the film formation efficiency.

Figure 19:
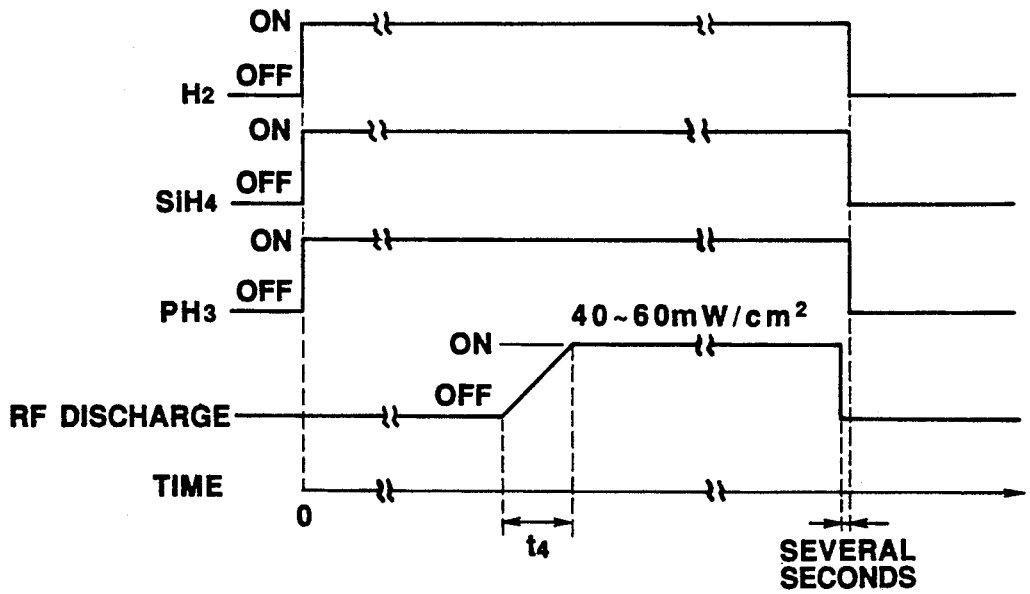
FIG. 19 is a timing chart showing a start timing of RF discharge and an RF discharge power supply state when a film different from a film formed by the manufacturing method of FIG. 18 is to be formed by a manufacturing method of the present invention.

A third application example in which the third embodiment is applied to formation of an $n^+$-a-Si film will be described below. FIG. 19 is a timing chart of gas supply and RF discharge in formation of $n^+$-a-Si film. The $n^+$-a-Si film is formed as follows.

$SiH_4$, $PH_3$, and $H_2$ gases constituting a process gas are supplied to the chamber, the substrate temperature and the internal pressure of the chamber are adjusted, and an RF discharge is started. At the time of the start of RF discharge, a rate of increase in discharge power density to a set value is controlled to fall within the range of 2 to 5 $mW/cm^2$ per second. The set value of the discharge power density in formation of this $n^+$-a-Si film is 40 to 60 $mW/cm^2$ as information of the a-Si:H film of the second application example of the third embodiment. A relationship between a time $t_4$ required to increase the discharge power density to the set value, the set value of the discharge power density, and the rate of increase in discharge power density is the same as that in [Table 2]. The RF discharge and the gas supply are stopped in the same manner as in the third embodiment upon a lapse of the film formation time.

In the third application example of the third embodiment, at the time of the start of RF discharge, since the discharge power density is slowly increased to the set value in the range of 2 to 5 $mW/cm^2$ per second, the resultant $n^+$-a-Si film is free from defects such as pinholes and weak spots and has stable characteristics. This $n^+$-a-Si film has good conductive characteristics.

In the third application example of the third embodiment, the rate of increase in discharge power density is set to fall within the range of 3 to 10 $mW/cm^2$ per second but may fall within the range of 2 to 10 $mW/cm^2$ per second as in the second application example of the third embodiment.

As described above, according to the method of forming silicon-based thin films of the present invention, the RF discharge power density is reduced to fall within the range of 60 to 100 mW/cm$^2$ to form a silicon nitride film having a high breakdown voltage at a film formation temperature of 230° C. to 270° C. As in the second embodiment, a composition of the process gas can be selected to set a composition ratio of a silicon nitride film to be larger than a stoichiometric ratio, thereby forming a silicon nitride film having a high breakdown voltage. In addition, as in the second and third embodiments, supply of a process gas and a start timing of RF discharge are controlled, or a rate of increase in RF discharge power is controlled to obtain a silicon nitride film having a high breakdown voltage. According to the present invention, when the technique of the first embodiment is combined with at least one of the techniques of the second and third embodiments, a silicon nitride film or a silicon oxide film which is almost free from defects and having a high breakdown voltage can be formed at low film formation temperatures. For example, an RF discharge power density is reduced to fall within the range of 60 to 100 mW/cm$^2$, a process gas consisting of a main reaction gas (i.e., SiH$_4$ and NH$_3$) and a carrier gas (i.e., N$_2$) is used, and a gas flow rate ratio is set to be 1:1:14 to 1:2.7:12.3. In this case, the carrier gas may be supplied first, the RF discharge may be started, and then the main reaction gas may be supplied to the chamber.

Fourth Embodiment

Figure 20:
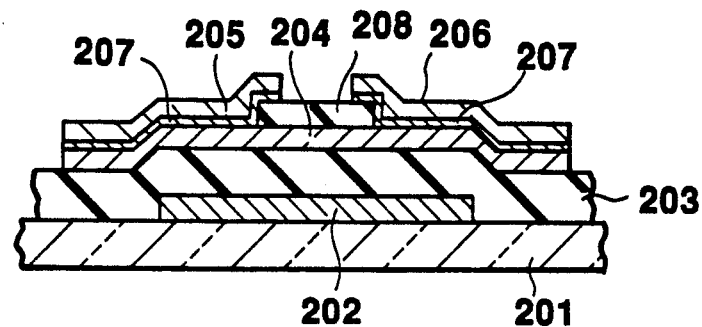
FIG. 20 is a sectional view showing a structure of a TFT manufactured by the method of the present invention.

Methods of forming silicon-based thin films of the first to third embodiments can be applied to a method of manufacturing a thin film used in a TFT. FIG. 20 shows a structure of a TFT manufactured by the method of the present invention. Referring to FIG. 20, a gate electrode 202 consisting of a metal such as tantalum or chromium is formed on an insulating substrate 201 made of glass or the like, and a gate insulating film 203 is formed on the gate electrode 202. An i-type semiconductor film 204 consisting of i-type amorphous silicon (i-a-Si) is formed on the gate insulating film 203 so as to oppose the gate electrode 202. A blocking layer 208 is formed on the upper central portion of the i-type semiconductor film 204 so as to cover its channel region. Source and drain electrodes 205 and 206 consisting of a metal such as chromium are formed at end portions of the i-type semiconductor film 204 to be in ohmic contact with the i-type semiconductor film 204 through an n-type semiconductor layer 207 consisting of impurity-doped n-type amorphous silicon (n$^+$-a-Si).

A method of manufacturing this TFT will be described below.

The TFT shown in FIG. 20 will be manufactured by the following steps.

Figure 21A:
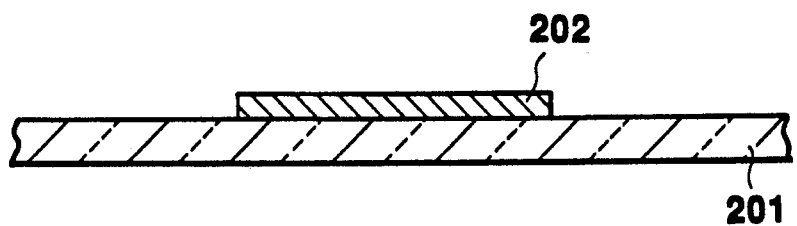
FIGS. 21A, 21B, 21C, and 21D are sectional views showing steps in manufacturing the TFT shown in FIG. 20.

A metal film consisting of chromium, tantalum, a tantalum-molybdenum alloy, or the like is formed on an insulating substrate 201 by a sputtering method and is patterned to form a gate electrode 202 (FIG. 21A).

Figure 21B:
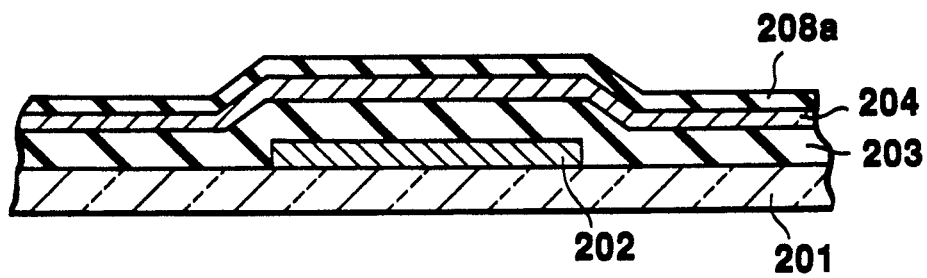

A silicon nitride film serving as a gate insulating film 203, an i-a-Si film serving as an i-type semiconductor film 204, and a silicon nitride film 208a serving as a blocking layer are continuously formed on the gate electrode 202 and the entire surface of the substrate 201 having the gate electrode 202 thereon (FIG. 21B).

The gate insulating film 203, the i-type semiconductor film 204, and the silicon nitride film 208a are continuously formed by using a plasma CVD apparatus as follows.

Figure 22:
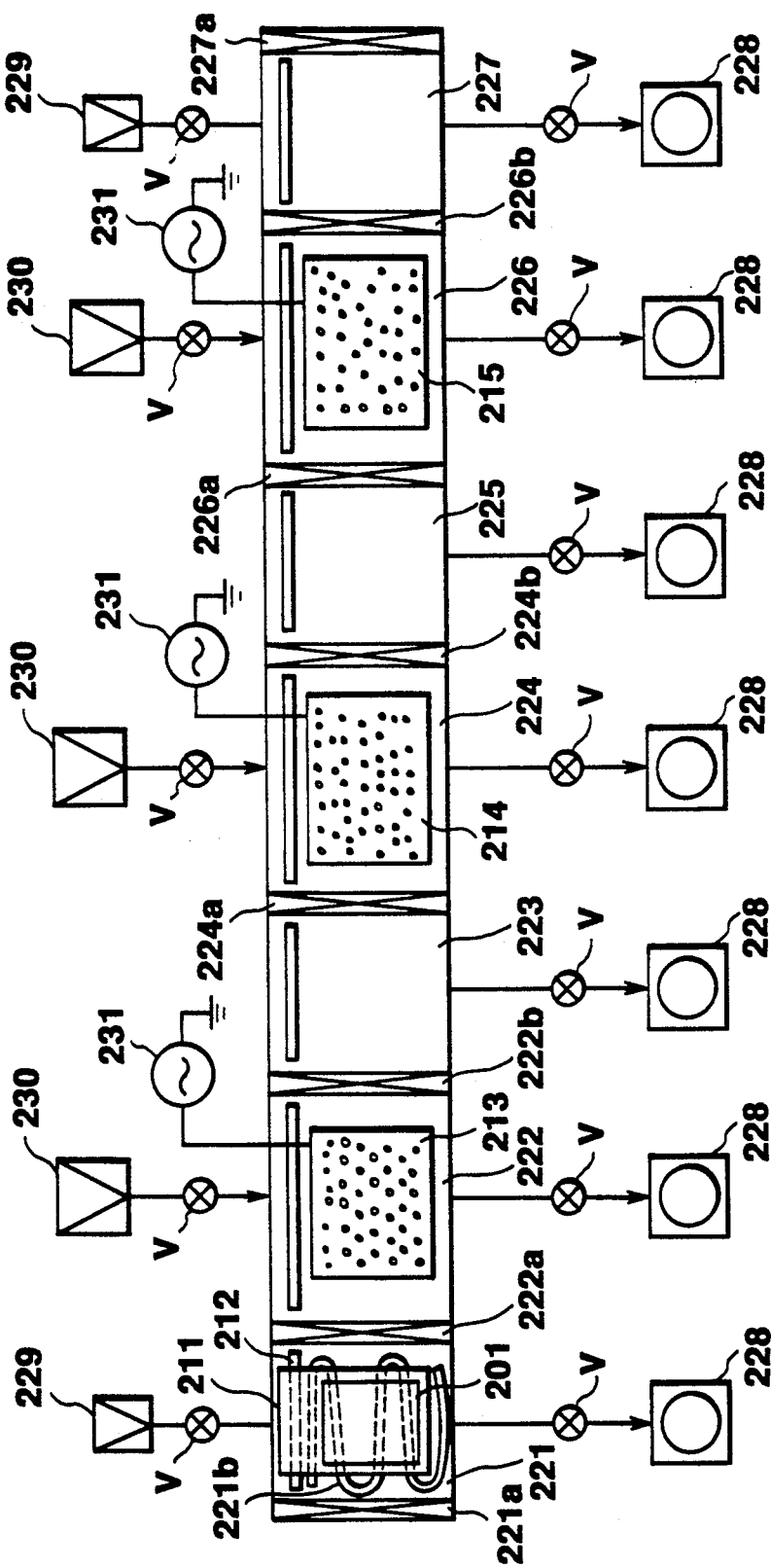
FIG. 22 is a schematic view of a plasma CVD apparatus used in the manufacturing method of the present invention.

FIG. 22 shows an arrangement of the plasma CVD apparatus used in formation of the gate insulating film 203, the i-a-Si layer 204, and the silicon nitride film 208a. This CVD apparatus comprises a substrate loading chamber 221, a silicon nitride film formation chamber (to be referred to as a gate insulating film formation chamber hereinafter) 222 for forming the gate insulating film, a first transfer chamber 223, an amorphous silicon film formation chamber (to be referred to as an i-a-Si formation chamber hereinafter) 224 for forming the i-a-Si layer, a second transfer chamber 225, a silicon nitride film formation chamber (to be referred to as a blocking layer formation chamber hereinafter) 226 for forming the blocking layer (silicon nitride film 208a), and a substrate unloading chamber 227. These chambers are formed contiguous to each other.

The gate insulating film formation chamber 222, the i-type semiconductor film formation chamber 224, and the blocking layer formation chamber 226 have the same structure as those in the plasma CVD apparatus shown in FIG. 5. A vacuum pump 228 is connected to each chamber through a valve V. Inert gas supply units 229 are connected to the substrate loading chamber 221 and the substrate unloading chamber 227 through valves V, respectively. A process gas supply unit 230 and a high-frequency power source 231 are connected to each of the gate insulating film formation chamber 222, the i-a-Si film formation chamber 224, and the blocking layer formation chamber 226, respectively.

In the plasma CVD apparatus shown in FIG. 22, an inert gas is supplied to the substrate loading chamber 221, and a door 221a is opened to mount a substrate holder 221 having substrates 201 thereon on a holder moving mechanism 212 in the chamber. The door 221a is then closed. In the substrate loading chamber 221, the substrates 201 are heated to a predetermined temperature of 230° C. to 270° C. as the film formation temperature range, for example, to a temperature of 250° C. of the first embodiment by a heater 221b. After the substrates are heated to the predetermined temperature, the substrate loading chamber 221 is evacuated, and a door 222a of the gate insulating film formation chamber 222 is opened to transfer the substrate holder 211 to the gate insulating film formation chamber 222. The substrates 201 are set to oppose RF electrodes 213. Thereafter, a process gas is supplied to the gate insulating film formation chamber 222. A high-frequency power is supplied from the high-frequency power source 231 to the RF electrodes 213 while the substrate temperature is kept at 250° C. to start an RF discharge, thereby depositing an SiN film on each substrate. In this case, the RF discharge power density is controlled to be 60 to 100 mW/cm$^2$.

When each SiN film has a predetermined thickness, and formation of the gate insulating films on the respective substrates 201 is completed, a door 222b is opened to transfer the substrates 201 to the first transfer chamber 223. After the door 222b is closed, the gas in the chamber 223 is discharged. When the gas in the first transfer chamber 223 is completely discharged, a door 224a of the i-a-Si film formation chamber is opened, and the substrates 201 mounted on the substrate holder 211 are transferred to the i-a-Si film formation chamber 224. The substrates 201 are set to oppose RF electrodes 214. Thereafter, a process gas is supplied to the i-a-Si film formation chamber 224, and a high-frequency power is supplied from the high-frequency power source 231 to the RF electrodes 214 to start an RF discharge while the substrate temperature is kept at 250° C., thereby depositing an i-a-Si film on each substrate. In this case, the RF discharge power density is controlled to be 40 to 50 mW/cm$^2$.

When the i-a-Si film on each substrate has a predetermined thickness, and formation of i-type semiconductor films on the respective substrates is completed, a door 224b is opened to transfer the substrates 201 to the second transfer chamber 225. After the door 224b is closed, the gas in the chamber 225 is discharged. When the gas in the second transfer chamber 225 is completely discharged, a door 226a of the blocking layer formation chamber 226 is opened to transfer the substrates 201 mounted on the substrate holder 221 to the blocking layer formation chamber 226. The substrates 201 are set to oppose RF electrodes 215. A process gas is supplied to the blocking layer formation chamber 226, and a high-frequency power is supplied form the high-frequency power source to the RF electrodes 215 to start an RF discharge while the substrate temperature is kept at 250° C. An SiN film is deposited on each substrate. In this case, the RF discharge power density is controlled to be 60 to 100 mW/cm$^2$ as in the film formation condition of the gate insulating film.

When the SiN film on each substrate has a predetermined thickness and formation of blocking layers on the respective substrates is completed, a door 226b is opened to transfer the substrates 201 to the substrate unloading chamber 227. After the door 226b is closed, an inert gas is supplied to the substrate unloading chamber 227 to restore the internal pressure to the atmospheric pressure and to cool the substrates 201 to room temperature. A door 227a is opened to remove the cooled substrates 201 together with the substrate holder 211 outside the chamber 227.

During the process of film formation, it takes a long period of time to heat the substrates to a silicon nitride film formation temperature and to cool the substrates 201 before they are removed from the substrate unloading chamber 227 so as to protect the formed SiN and i-a-Si films from cracks caused by thermal distortion.

During the film formation, the process gases supplied to the gate insulating film formation chamber and the blocking layer formation chamber are the same as those in the first embodiment. That is, monosilane or disilane gas and ammonia gas constitute a main reaction gas, and nitrogen, hydrogen, helium, or a mixture thereof is used as a carrier gas. When SiH$_4$ and NH$_3$ constitute a main reaction gas and N$_2$ is used as a carrier gas, a mixing ratio of SiH$_4$, NH$_3$, and N$_2$ is 1:1:14 to 1:2.7:12.3. In the above embodiment, the films are formed under the same conditions as in the first embodiment.

The process gas supplied to the i-a-Si film formation chamber 224 consists of monosilane gas as a main reaction gas and hydrogen as a carrier gas.

Figure 21C:
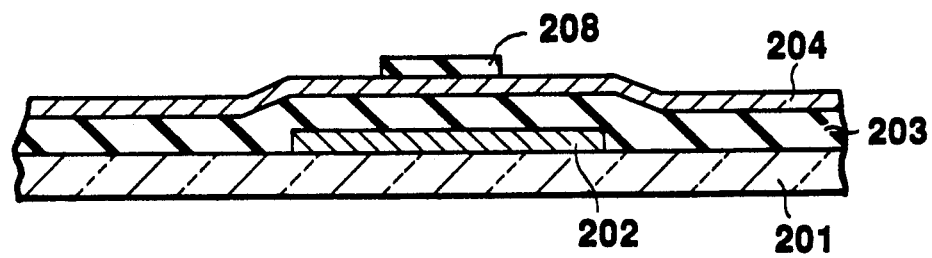

The silicon nitride film 208a of the stack of the silicon nitride film 203, the i-a-Si film 204, and the silicon nitride film 208a continuously formed on the substrate is patterned into a shape corresponding to that of the channel region, thereby forming the blocking layer 208 (FIG. 21C).

Figure 21D:
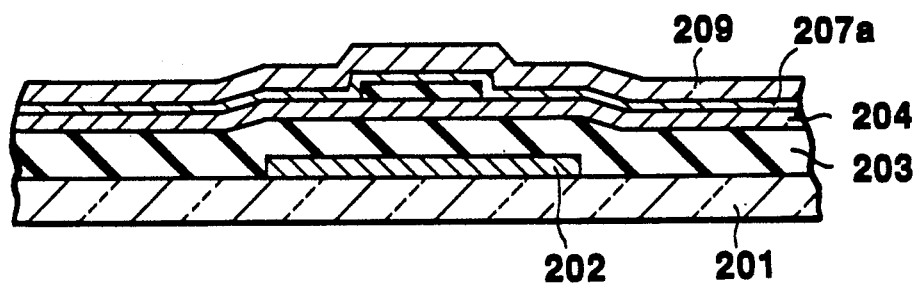

An n$^+$-a-Si film 207a for obtaining an ohmic contact with the i-a-Si film, and a metal film 209 are continuously formed on the i-a-Si film 204 (FIG. 21D).

The n$^+$-a-Si film 207a and the metal layer 209 are patterned to have shapes corresponding to the source and drain electrodes 205 and 206, thereby forming a TFT shown in FIG. 20.

The SiN film serving as the gate insulating film, the SiN serving as the blocking insulating film, and the i-a-Si layer serving as the i-type semiconductor layer are formed at about 250° C. Therefore, the gate insulating film, the blocking layer, and the i-type semiconductor layer can be continuously formed without adjusting the substrate temperature during film formation. According to this manufacturing method, the time required for forming the gate insulating film, the blocking layer, and the i-type semiconductor layer can be greatly shortened and a thin film transistor can be manufactured with high efficiency.

In this manufacturing method, the gate SiN film, the blocking SiN film, and the i-a-Si layer are formed at about 250° C. Since the i-a-Si layer is formed at this film formation temperature, the semiconductor characteristics of the i-a-Si layer are not degraded.

Since the gate SiN film and the blocking SiN film are formed at the RF discharge power density of 60 to 100 mW/cm$^2$, the gate and blocking SiN films can have sufficiently high breakdown voltages even if the film formation temperature is as low as about 250° C.

According to this manufacturing method, a thin film transistor having excellent characteristics can be obtained wherein the i-type semiconductor layer has excellent semiconductor characteristics and the gate insulating film has a sufficiently high breakdown voltage.

The above embodiment exemplifies an inverted staggered type thin film transistor having a blocking insulating film. However, the present invention is also applicable to the manufacture of an inverted staggered type thin film transistor having no blocking insulating film. In this case, a gate insulating film, an i-type semiconductor film, and an n-type semiconductor layer can be continuously formed. In this case, a plasma CVD apparatus having an n$^+$-a-Si film formation chamber is used in place of the plasma CV apparatus having the blocking layer formation chamber 226 shown in FIG. 22.

Figure 23:
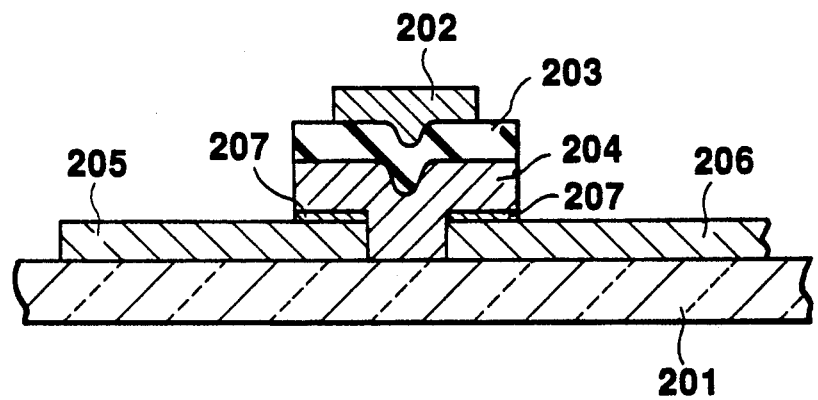
FIG. 23 is a sectional view of a structure of a TFT which is manufactured by the method of the present invention and different from that shown in FIG. 20.

The present invention is also applicable to the manufacture of a staggered type thin film transistor having an inverted structure of an inverted staggered type thin film transistor. A staggered type TFT is shown in FIG. 23. The same reference numerals as in FIG. 22 denote the same parts in FIG. 23. In this case, an i-a-Si layer 204 and a gate insulating film 203 are continuously formed. In this case, the plasma CVD apparatus has a substrate loading chamber, an i-type semiconductor layer formation chamber, a gate insulating film formation chamber, and a substrate unloading chamber, all of which are contiguous to each other.

Fifth Embodiment

The fifth embodiment provides a TFT wherein a gate insulating film has a two-layered structure consisting of an SiN film having a high breakdown voltage and an SiN film having a good interface property with an i-type semiconductor film. This embodiment will be described in detail.

Figure 24:
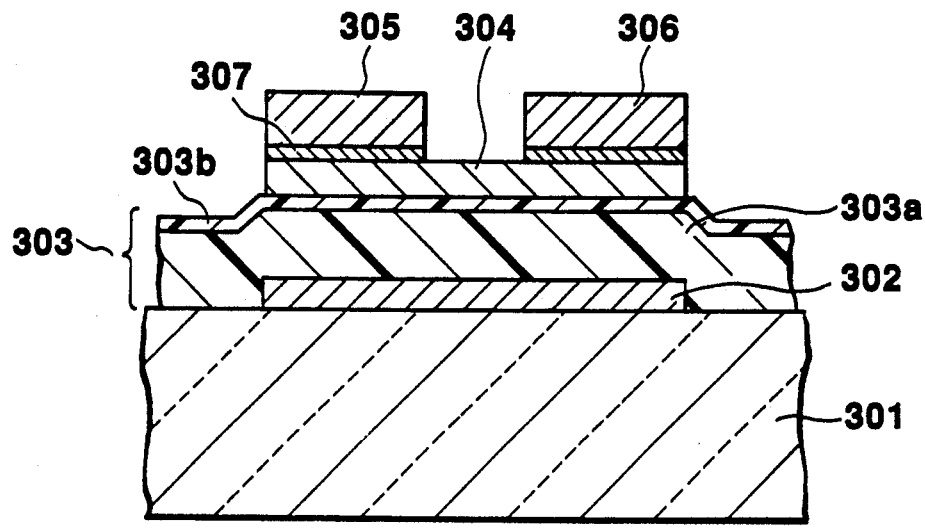
FIG. 24 is a sectional view of a structure of a TFT which is manufactured by the method of the present invention and different from that shown in FIG. 23.

In the thin film transistor of the fifth embodiment, as shown in FIG. 24, a gate electrode 302 is formed on an insulating substrate 301 consisting of glass, and a gate insulating film 303 is formed on the gate electrode 302. A semiconductor layer 304 consisting of amorphous silicon or polysilicon is formed on the gate insulating film 303 so as to oppose the gate electrode 302. Source and drain electrodes 305 and 306 are formed at both end portions of the semiconductor layer 304 via an ohmic contact layer 307 consisting of impurity-doped n-type amorphous silicon or polysilicon.

Figure 25:
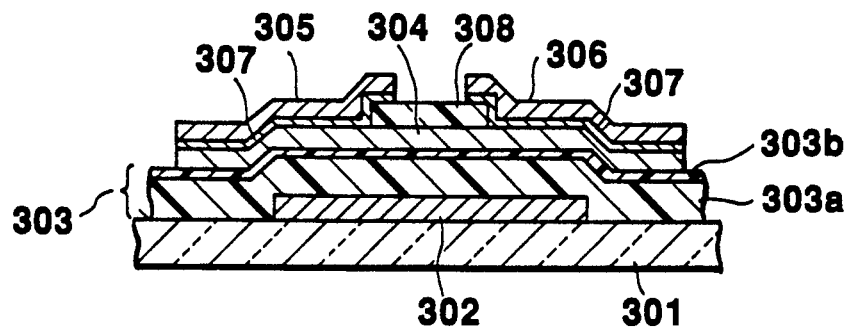
FIG. 25 is a sectional view of a structure of a TFT which is manufactured by the method of the present invention and different from that shown in FIG. 24.

This embodiment is also applicable to a TFT shown in FIG. 25. In this TFT, a blocking layer 308 is formed on a portion corresponding to a channel region of an i-type semiconductor layer. The same reference numerals as in FIG. 22 denote the same parts in FIG. 25, and a detailed description thereof will be omitted.

A gate insulating film 303 consists of an Si-rich silicon nitride film 303a having a larger number of silicon atoms (Si) than that represented by a stoichiometric ratio (Si/N=0.75), and an N-rich silicon nitride film 303b formed in a portion of the gate insulating film 303 near the interface with a semiconductor layer 304 and having a larger number of nitrogen atoms (N) than that represented by the stoichiometric ratio. The thickness of the gate insulating film 303 is about 1,100 Å, and the thickness of the N-rich silicon nitride film 303b at the interface with the semiconductor layer 304 is about 100 Å.

The silicon nitride film 303a having a larger number of silicon atoms in the gate insulating film 303 is formed by a plasma CVD apparatus in accordance with the following film formation conditions:

| Substrate Temperature: | | 250° C. |
|---|---|---|
| Main Reaction Gas: | SiH4 | 30 cc/M |
| | NH3 | 60 cc/M |
| Carrier Gas: | N2 | 390 cc/M |
| Pressure: | | 0.5 Torr |
| RF Discharge Frequency: | | 13.56 MHz |
| Discharge Power Density: | | 84 mW/cm$^2$ |

A composition ratio of the silicon nitride film formed at an RF discharge power density of 84 mW/cm$^2$ is Si/N=0.83.

The N-rich silicon nitride film 303b at the interface with the semiconductor layer 304 is formed by a plasma CVD apparatus under the same conditions as formation of the silicon nitride film having a larger number of silicon atoms, except that the RF discharge power density is controlled to be 127 mW/cm$^2$. In this manner, a composition ratio of the silicon nitride film formed at the RF discharge power density of 127 mW/cm$^2$ is Si/N=0.69.

In this thin film transistor of the fifth embodiment, since the gate insulating film 303 includes a silicon nitride film having a larger number of silicon atoms than that represented by the stoichiometric ratio, the gate insulating film 303 has a sufficiently high breakdown voltage as in the first embodiment.

Since the silicon nitride film 303a having a larger number of silicon atoms than that represented by the stoichiometric ratio is mainly used to form the gate insulating film 303, breakdown between the gate electrode 302 and the source and drain electrodes 305 and 306 is perfectly prevented in the thin film transistor of this embodiment. In addition, since the thickness of the gate insulating film 303 can be as small as about 1,100 Å, a stronger electric field can be applied to the semiconductor layer 304 to increase an ON current even if the gate voltage applied to the gate electrode 302 remains the same.

If the gate insulating film 303 consists of a silicon nitride film 303a having a larger number of silicon atoms than that represented by the stoichiometric ratio, hysteresis characteristics appear in the $V_G$-$I_D$ characteristic curve of the thin film transistor. In the thin film transistor of this embodiment, since the silicon nitride film 303b having a larger number of nitrogen atoms than that represented by the stoichiometric ratio is formed at an interface of the gate insulating film 303 with the semiconductor layer 304 and the hysteresis characteristics of the $V_G$-$I_D$ characteristic curve is determined by a film composition at the interface of the gate insulating film 303 with the semiconductor layer 304, the thin film transistor has good $V_G$-$I_D$ characteristics without hysteresis characteristics.

Figure 26:
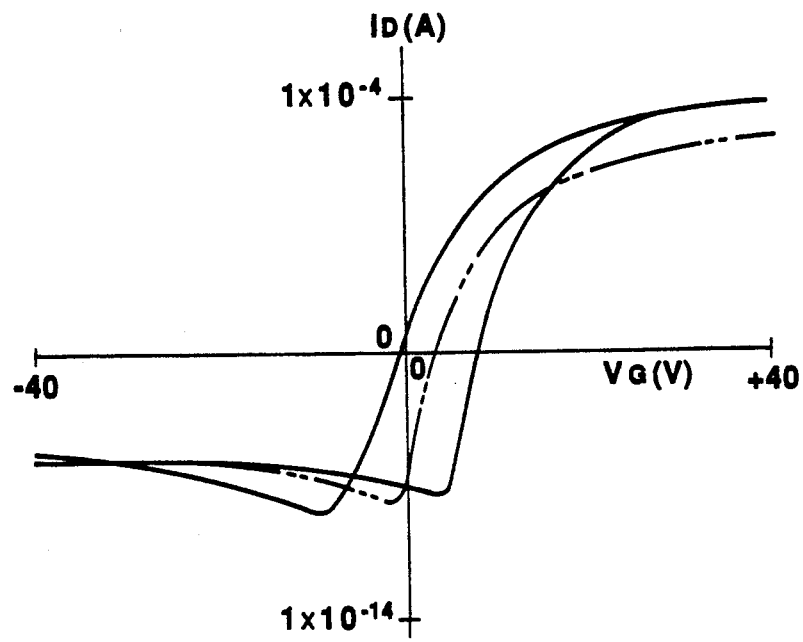
FIG. 26 is a graph showing I-V characteristics of a TFT manufactured by the method of the present invention.
Figure 27:
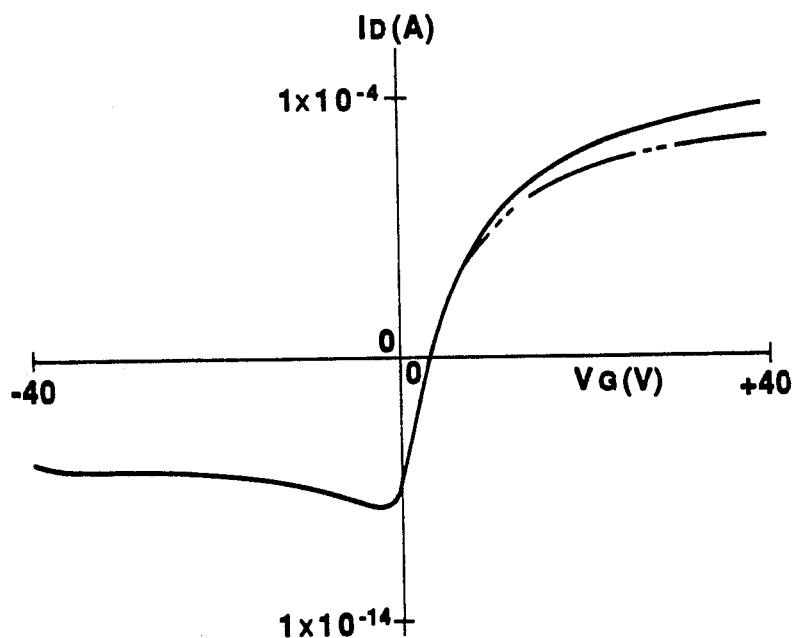
FIG. 27 is a graph showing I-V characteristics of the TFT shown in FIG. 24.

FIGS. 26 and 27 show $V_G$-$I_D$ characteristic curves (solid curves) of a thin film transistor having the gate insulating film 303 consisting of only a silicon nitride film having a larger number of silicon atoms than that represented by the stoichiometric ratio and a thin film transistor having the gate insulating film 303 consisting of both silicon nitride films 303a, 303b having a larger number of silicon atoms than that represented by the stoichiometric ratio and the silicon nitride film 303b having a larger number of nitrogen atoms than that represented by the stoichiometric ratio. When the gate insulating film consists of only a silicon nitride film having a larger number of silicon atoms, hysteresis characteristics appear in the $V_G$-$I_D$ characteristic curve as shown in FIG. 26. However, when the gate insulating film 303 also has the silicon nitride film 303b which has a larger number of nitrogen atoms and which is formed at the interface of the gate insulating film 303 with the semiconductor layer 304, the $V_G$-$I_D$ characteristic curve does not have any hysteresis, as shown in FIG. 27.

The thickness of the silicon nitride film 303b having a larger number of nitrogen atoms is sufficiently about 100 Å. Even if the silicon nitride film 303b is formed on the surface of the silicon nitride film (thickness: about 1,000 Å) 303a, the total thickness of the insulating film is about 1,100 Å. The ON current of the thin film transistor of the fifth embodiment is sufficiently larger than that of the conventional thin film transistor (gate insulating film thickness: 3,000 to 4,000 Å) having the $V_G$-$I_D$ characteristic curve indicated by the alternate long and two short dashed line in FIG. 27.

In this embodiment, since the Si-rich nitride film 303a and the N-rich nitride film 303b formed near the semiconductor layer 304 are formed by the plasma CVD apparatus at the RF discharge power densities of 84 mW/cm$^2$ and 127 mW/cm$^2$, respectively, these silicon nitride films 303a and 303b can be continuously formed by the plasma CVD apparatus.

In the fifth embodiment, a silicon nitride film having a larger number of silicon atoms and serving as the gate insulating film 303 is formed at the RF discharge power density of 84 mW/cm$^2$. However, this silicon nitride film can be formed within the discharge power density range of 60 to 100 mW/cm$^2$. Any silicon nitride film formed within this range of the discharge power density has a high breakdown voltage.

In addition, a silicon nitride film having a larger number of nitrogen atoms and serving as the silicon nitride film 303b at the interface with the semiconductor layer 304 may be formed at an RF discharge power density of 110 mW/cm$^2$ or more. However, a preferable discharge power density for forming this silicon nitride film is a maximum of about 250 mW/cm$^2$. The Si-rich nitride film 303a and N-rich nitride film 303b may be formed in the aforementioned step of forming the gate insulating film 303, by changing the composition of the process gas after the formation of the insulating film.

The thin film transistor of this embodiment is of an inverted staggered type. However, the present invention is equally applicable to staggered, coplanar, and inverted coplanar type thin film transistors, as a matter of course.

What is claimed is:

1. A method of forming a thin film consisting of a silicon-based material, comprising:

a first step of setting a substrate, on which the thin insulating film consisting of said silicon-based material is to be formed, in a chamber having high-frequency electrodes for receiving a high-frequency power when said substrate is maintained heated at a predetermined temperature;

a second step of supplying a carrier gas and a reaction gas into said chamber, including a first substep of supplying a carrier gas into said chamber, a second substep of adjusting an internal pressure and a temperature of said chamber to a predetermined pressure and a predetermined temperature, respectively, a third substep of supplying a high-frequency power between said substrate and said high-frequency electrodes, and a fourth substep of supplying a main reaction gas to said chamber after an electric discharge occurs upon supply of the high-frequency power;

a third step of applying a high-frequency power having a discharge power density of 60 to 100 mW/cm$^2$ to said high-frequency electrodes to generate a plasma in said chamber;

a fourth step of maintaining said predetermined temperature of said substrate in the first step between 230° C. and 270° C., and of depositing an insulator consisting of a silicon-based material on said substrate to a predetermined thickness while gas is supplied in the second step and while the high-frequency power is supplied in the third step; and a fifth step of cooling said substrate on which said insulating film is formed and unloading said substrate from said chamber.

2. A method according to claim 1, wherein the first step includes a substep of heating said substrate to a temperature range of about 230° C. to 270° C.

3. A method according to claim 1, wherein the first step includes a first substep of preheating said substrate before said substrate is set in said chamber, and a second substep of maintaining a temperature of said substrate set in said chamber in a range of about 230° C. to 270° C.

4. A method according to claim 1, wherein the second step includes a further substep of controlling a mixing ratio of $N_2$ gas as a carrier gas and $SiH_4$ and $NH_3$ gases as a main reaction gas, so that the mixing ratio of the $SiH_4$, $NH_3$, and $N_2$ gases falls within the range of 1:1:14 to 1:2.7:12.3.

5. A method according to claim 1, wherein
the carrier gas supplied into said chamber in the first substep is nitrogen gas, and
the main reaction gas supplied to said chamber in the fourth substep is constituted by silane gas and ammonia gas, thereby forming said insulating film essentially consisting of silicon nitride on said substrate.

6. A method according to claim 5, wherein the fourth substep includes a substep of starting supplying of the ammonia gas constituting the main reaction gas, and a substep of starting supplying the silane gas after supply of the ammonia gas is started.

7. A method according to claim 1, wherein
the carrier gas supplied into said chamber in the first substep is nitrogen gas, and
the main reaction gas supplied into said chamber in the fourth substep is constituted by silane gas and $N_2O$ gas, thereby forming said insulating film essentially consisting of silicon oxide on said substrate.

8. A method according to claim 7, wherein the fourth substep includes a substep of starting supplying the $N_2O$ gas constituting the main reaction gas and a substep of starting supplying the silane gas after supply of the $N_2O$ gas is started.

9. A method according to claim 1, wherein the third step includes a first substep of supplying a high-frequency power so that a discharge power density thereof is increased at a rate of 2 to 10 mW/cm$^2$ per second, and a second substep of maintaining the high-frequency power substantially constant after the high-frequency power reaches a predetermined value.

10. A method of manufacturing a thin film transistor, comprising:

a first step of forming a gate electrode on an insulating substrate;

a second step of forming a gate insulating film made of a silicon nitride film by a plasma CVD method so as to cover said gate electrode, said plasma CVD method controlling a substrate temperature to fall within a range of 230° to 270° C. and a high-frequency discharge power density to fall within a range of 60 to 100 mW/cm$^2$;

a third step of forming an i-type semiconductor film made of an amorphous silicon layer by a plasma CVD method which controls a film formation temperature to fall within a range of 230° to 270° C.; and a fourth step of forming source and drain electrodes which are electrically connected to said i-type semiconductor film through an n-type semiconductor film and which are spaced apart from each other by a predetermined distance to form a channel region of said i-type semiconductor film.

11. A method according to claim 10, wherein the second step is performed by a plasma CVD method controlled to have a film formation temperature substantially equal to a film formation temperature of the amorphous silicon layer formed in the third step.

12. A method according to claim 11, wherein a film formation temperature of the amorphous silicon layer formed in the third step is about 250° C.

13. A method according to claim 10, wherein said gate insulating film essentially consisting of said silicon nitride film in the second step and said i-type semiconductor film essentially consisting of said amorphous silicon layer formed in the third step are continuously formed by a continuous type plasma CVD apparatus.

14. A method according to claim 10, further comprising a fifth step of forming a silicon nitride film having a larger number of nitrogen atoms than that represented by a stoichiometric ratio between said silicon nitride film formed in the second step and said amorphous silicon layer formed in the third step.

15. A method according to claim 14, wherein the fifth step includes a substep of forming a silicon nitride film by a plasma CVD method controlled to have the high-frequency discharge power density of 110 mW/cm$^2$.

16. A method of manufacturing a thin film transistor, comprising:

a first step of forming source and drain electrodes on an insulating substrate to be spaced apart from each other by a predetermined distance;

a second step of forming an n-type semiconductor film on said source and drain electrodes;

a third step of forming an i-type semiconductor film which comprises an amorphous silicon film formed by a plasma CVD method controlled to have a film formation temperature of 230° C. to 270° C. and which is electrically connected to said source and drain electrodes through the n-type semiconductor film;

a fourth step of forming a gate insulating film comprising a silicon nitride film by a plasma CVD method so as to cover said i-type semiconductor film, said plasma CVD method controlling a substrate temperature to fall within a range of 230° C. to 270° C. and a high-frequency power density to fall within a range of 60 to 100 mW/cm$^2$; and a fifth step of forming a gate electrode on said gate insulating film so as to oppose said i-type semiconductor film.

17. A method according to claim 16, wherein the third step is performed by a plasma CVD method controlled to have a film formation temperature substantially equal to a film formation temperature of said amorphous silicon layer formed in the second step.

18. A method according to claim 16, wherein said i-type semiconductor film comprising said amorphous silicon layer in the second step and said gate insulating film comprising said silicon nitride film in the third step are continuously formed by a continuous type plasma CVD apparatus.

* * * * *